(12) United States Patent
Cu-Unjieng et al.

(10) Patent No.: US 11,562,105 B2
(45) Date of Patent: Jan. 24, 2023

(54) SYSTEM AND METHOD FOR MODULE ENGINEERING WITH SEQUENCE LIBRARIES

(71) Applicant: Yokogawa Electric Corporation, Tokyo (JP)

(72) Inventors: Mark Anthony De Castro Cu-Unjieng, Singapore (SG); Isao Hirooka, Singapore (SG); Hideki Murata, Singapore (SG); Naing Oo Lin, Singapore (SG); Archie Sambitan Orido, Singapore (SG); Takeshi Mori, Singapore (SG); Efendi Supiman, Singapore (SG); Thin Sapal Yu, Singapore (SG); Janet Tria, Singapore (SG)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 754 days.

(21) Appl. No.: 16/508,584

(22) Filed: Jul. 11, 2019

(65) Prior Publication Data

US 2021/0011977 A1  Jan. 14, 2021

(51) Int. Cl.
*G05B 19/042* (2006.01)
*G06F 30/00* (2020.01)

(52) U.S. Cl.
CPC ......... *G06F 30/00* (2020.01); *G05B 19/0426* (2013.01); *G05B 2219/31104* (2013.01); *G05B 2219/33125* (2013.01)

(58) Field of Classification Search
CPC .......... G06F 30/00; G06F 16/23; G06F 16/21; G05B 19/0426; G05B 2219/31104;
(Continued)

(56) References Cited

U.S. PATENT DOCUMENTS

2006/0136497 A1\* 6/2006 Gikas ................. G05B 19/0426
2008/0058969 A1\* 3/2008 Nixon ................ G05B 19/0426
700/87

(Continued)

FOREIGN PATENT DOCUMENTS

EP  3 021 181 A1  5/2016

OTHER PUBLICATIONS

Extended European Search Report dated Aug. 7, 2020, issued by the European Patent Office in application No. 20153750.3.

*Primary Examiner* — Christopher E. Everett
(74) *Attorney, Agent, or Firm* — Sheridan Ross P.C.

(57) ABSTRACT

Method and system for engineering with sequence libraries are provided. A first set of engineering data is defined for a first engineering project to generate a first sequence library for the first engineering project, independently of one or more lower level engineering projects for configuring one or more field control systems. The sequence library assignment process is to assign the first sequence library to the one or more lower level engineering projects simultaneously to generate one or more first assigned sequence libraries for the one or more lower level engineering projects for configuring the one or more field control systems. The parallel configuration process is to perform a parallel configuration process which configures the first sequence library for the first engineering project, while assigning the first sequence library to another one or more lower level engineering projects.

27 Claims, 15 Drawing Sheets

(58) Field of Classification Search
CPC ........... G05B 2219/33125; G05B 2219/23261;
G05B 2219/25067; G05B 19/41845;
Y02P 90/02
See application file for complete search history.

(56) References Cited

U.S. PATENT DOCUMENTS

2009/0118846 A1    5/2009  Eldridge et al.
2016/0132037 A1*  5/2016  Weng ............... G05B 19/41845
                                                700/87

* cited by examiner

ENGINEERING OF SEQUENCE LIBRARIES IN SYSTEM VIEW

FLOW OF ENGINEERING USING SYSTEM VIEW

FLOW OF ENGINEERING USING SEQUENCE LIBRARY EDITOR

SEQUENTIAL FUNCTION CHART

SEQUENCE LIBRARY EDITOR FOR SEBOL LIBRARY TYPE

LIBRARY NAVIGATOR OF
AN ENGINEERING TOOL OF THE AUTOMATION ENGINEERING SYSTEM

FIG. 9
SEBOL BUILDER

```
SEBOL User's Functions Builder - [AD Pjt:ADPJT1 File:SEQ1.sva]
File  Edit  View  Tools  Window  Help 1 | integer function SEQ1(simple,array,n,max)
 2 |
 3 | argblock PID simple,array[*]    ! declaration of function bloak dummy argument
 4 | integer n,max                   ! element number of processing target
 5 |                                 ! and array size
 6 |
 7 |     simple.MV = 10.0
 8 |     wait until(simple/PV >= 9.9)
 9 |     if (n <= max) then
10 |         array[n].MV = 10.00
11 |         wait until(array.PV >= 9.9)
12 |
13 |     end if
14 | end
15 |
```

Message

Ready                                           Position: Line 1 Column 22  Change

SFC BUILDER

UNIT PROCEDURE BUILDER

SYSTEM STRUCTURE NAVIGATOR
SEQUENCE LIBRARY ASSIGNED TO FIELD CONTROL STATION

FILTER BY FIELD CONTROL SYSTEM DIALOG

SEQUENCE LIBRARY UPDATE MANAGER

EXPORT/IMPORT OF SEQUENCE LIBRARIES BETWEEN HIGHER-LEVEL AUTOMATION ENGINEERING PROJECTS

SYSTEM AND METHOD FOR MODULE ENGINEERING WITH SEQUENCE LIBRARIES

TECHNICAL FIELD

Embodiments of the present invention generally relate to a system and a method for module engineering with sequence libraries in an industrial plant.

BACKGROUND ART

[Overall of Module-Based Engineering]

In an industrial plant, a module-based engineering is useful for automation design. In general, servers of automation engineering systems centrally manage database of engineering data, which makes design information available for expanding, modifying, or maintaining the plant control system, and saves unnecessary manpower for fixing inconsistency between the design information and actual information stored in the plant control system. The module-based engineering refers to an engineering method to design control applications and alarms by transforming control logic and design information into modules and then combining the modules in the server of the automation engineering system. The modules, which may generally consist of independent software components such as customer information and know-hows gathered from the past design pattern experiences, may also include control logics, alarm attributes, and design information.

In related art, users can define sequence libraries for respective field control stations in system view of an automation engineering system. Users define a sequence library for each field control station separately. In the related art, the process for defining the sequence libraries in the system view of the automation engineering system is not part of a series of module-based engineering processes in automation design by an automation engineering system. In the related art, the automation engineering system is not configured to perform the engineering of sequence libraries or to define sequence libraries. The sequence libraries have three different types, SEBOL, Sequential Function Chart (SFC) and Unit Procedure.

FIG. 1 is a schematic view illustrating the automation engineering system with sequence libraries defined by a system view of the automation engineering system in related art. In FIG. 1, the automation engineering system in related art is configured to allow users to define a sequence library for each field control station separately and store a respective sequence library for each field control station separately. Users must define a lot of sequence libraries for a lot of field control stations separately. The automation engineering system in related art is not configured to allow centralized definition and management of sequence libraries. In some cases, it is necessary to reuse sequence libraries among field control stations. In order to reuse the sequence libraries among the field control systems, there needs to perform manual, non-automation, duplication process or import/export process to sequence library builders from one field control system to another field control system. Under the system view, engineering of the sequence libraries is performed either by importing sequence library files from a database, which stores reusable sequence library files, into any field control system or by creating and modifying sequence libraries using a respective builder such as, a SEBOL builder, a Sequential Function Chart (SFC) builder or a Unit Procedure builder under each field control station which belongs to an engineering project which has a varied number of field control systems in accordance with the project complexity and different engineering requirements of engineering projects. This limits the usability and reusability of module engineering data of the automation design system.

Further, the automation engineering system in related art is not configured to perform any central management for sequence libraries. Thus, the automation engineering system in related art needs to separately update sequence libraries in a plurality of field control stations and manage those sequence libraries through manual operation, i.e. editing of sequence libraries in the corresponding editor for each field control system one by one. By way of an example, for one sequence library created, which has been assigned to multiple field control systems, when performing update process, it is still required for users to modify and update an assigned sequence library under each field control system, which is tedious and error-prone. Since sequence libraries are excluded in the module engineering of the automation design system, user must do engineering in both the engineering tool of the automation engineering system and System View in order to complete the engineering of each field control system which requires the sequence libraries. Similarly, additional steps and complexity are incurred when exporting and importing engineering data of field control stations because those engineering data for both the engineering tool of the automation engineering system and system view, field control stations must be restored together due to the needs of manual import and export of sequence libraries, in order to re-use the exported engineering data of the sequence libraries of field control stations. This further limits the usability and reusability of module engineering data of the automation design system.

SUMMARY

In some embodiments, a computer-implemented engineering method may include, but is not limited to, a sequence library generation process, a sequence library assignment process and a parallel configuration process. The sequence library generation process is to define a first set of engineering data for a first engineering project to generate a first sequence library for the first engineering project, independently of one or more lower level engineering projects for configuring one or more field control systems of an engineering plant. The one or more lower level engineering projects are lower in engineering-project-hierarchy-level than the first engineering project. The sequence library assignment process is to assign the first sequence library to the one or more lower level engineering projects simultaneously to generate one or more first assigned sequence libraries for the one or more lower level engineering projects for configuring the one or more field control systems. The parallel configuration process is to perform a parallel configuration process which configures the first sequence library for the first engineering project, while assigning the first sequence library to another one or more lower level engineering projects.

BRIEF DESCRIPTION OF THE DRAWINGS

FIG. 9 is a view of a SEBOL builder of a sequence library builder set.

EMBODIMENTS

Figure 1:
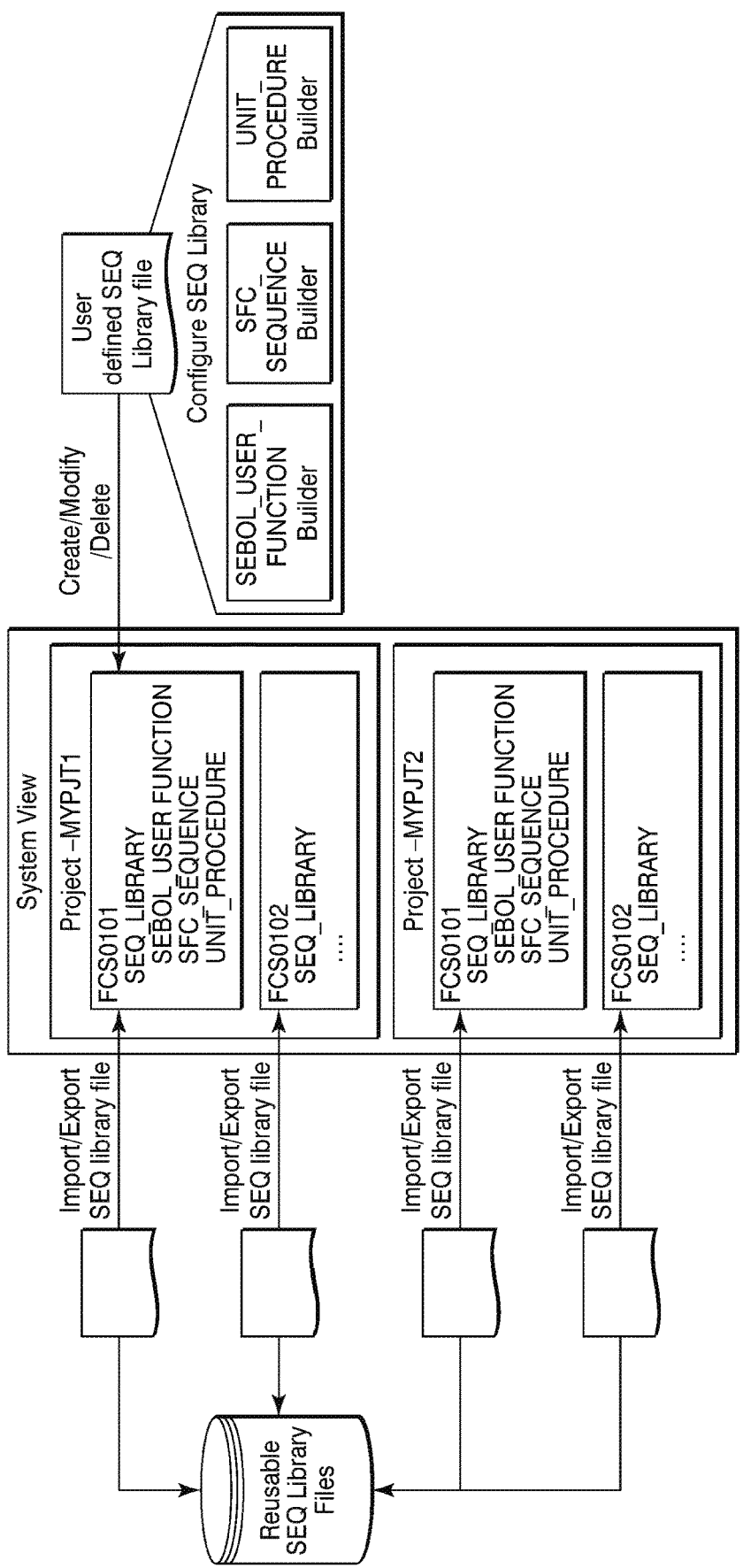
FIG. 1 is a schematic view illustrating the automation engineering system with sequence libraries defined by a system view of the automation engineering system in related art.

In some embodiments, a computer-implemented engineering method may include, but is not limited to, a sequence library generation process, a sequence library assignment process and a parallel configuration process. The sequence library generation process is to define a first set of engineering data for a first engineering project to generate a first sequence library for the first engineering project, independently of one or more lower level engineering projects for configuring one or more field control systems of an engineering plant. The one or more lower level engineering projects are lower in engineering-project-hierarchy-level than the first engineering project. The sequence library assignment process is to assign the first sequence library to the one or more lower level engineering projects simultaneously to generate one or more first assigned sequence libraries for the one or more lower level engineering projects for configuring the one or more field control systems. The parallel configuration process is to perform a parallel configuration process which configures the first sequence library for the first engineering project, while assigning the first sequence library to another one or more lower level engineering projects.

In some cases, the computer-implemented engineering method may include, but is not limited to, a sequence library modification process. The sequence library modification process is to modify the first sequence library for the first engineering project, to generate a first modified sequence library, independently of the one or more lower level engineering projects for configuring the one or more field control systems.

In some cases, the computer-implemented engineering method may include, but is not limited to, a sequence library updating process. The sequence library updating process is to update the first modified sequence library that has been assigned to the one or more lower level engineering projects to generate one or more first updated sequence libraries for the one or more lower level engineering projects.

In some cases, the computer-implemented engineering method may include, but is not limited to, a sequence library duplicating process. The sequence library duplicating process is to duplicate the first sequence library to generate a second sequence library for a second engineering project. The one or more lower level engineering projects are lower in engineering-project-hierarchy-level than the second engineering project. The second engineering project is the same in engineering-data-download-status, assignment-status and engineering-project-hierarchy-level as the first engineering project. The computer-implemented engineering method may include, but is not limited to, an additional sequence library assignment process. The additional sequence library assignment process is to assign the second updated sequence library, to another one or more lower level engineering projects simultaneously to generate one or more second assigned updated sequence libraries for the other one or more lower level engineering projects. The computer-implemented engineering method may include, but is not limited to, an additional parallel engineering process. The additional parallel engineering process is to perform a parallel engineering process for configuration which configures at least one of the first sequence library for the first engineering project and the second updated sequence library for the second engineering project, while assigning at least one of the first sequence library and the second updated sequence library to still other one or more lower level engineering projects. The computer-implemented engineering method may include, but is not limited to, a sequence library exporting process. The sequence library exporting process is to export the first set of engineering data of the first sequence library from the first engineering project. The computer-implemented engineering method may include, but is not limited to, a sequence library importing process. The sequence library importing process is to import the first set of engineering data exported from the first sequence library into the second sequence library of the second engineering project.

In some cases, the sequence library definition process may include to define the first set of engineering data, of which types include at least one of SEBOL_USER_FUNCTION, sequential function chart (SFC) and unit procedure. The sequence library definition process may further include to define a plurality of sequence library files belonging to the same type.

In some cases, the computer-implemented engineering method may include, but is not limited to, sequence library updating processes. The sequence library updating process is to update the first sequence library for the first engineering project. The sequence library updating process is to update the second updated sequence library for the second engineering project independently from updating the first sequence library.

In some cases, the computer-implemented engineering method may include, but is not limited to, sequence library updating processes. The sequence library updating process is to update the first sequence library for the first engineering project. The sequence library updating process is to update the one or more first assigned sequence libraries for the one or more lower level engineering projects. The computer-implemented engineering method may include, but is not limited to, an additional sequence library updating process. The additional sequence library updating process is to update the one or more first assigned sequence libraries for the one or more lower level engineering projects in according with a user selection of the first assigned sequence library of the one or more lower level engineering projects.

In some cases, the sequence library assignment process to assign the first sequence library to the one or more lower level engineering projects may include to assign the first sequence library to a plurality of lower level engineering projects which are different from each other simultaneously to generate a plurality of first assigned sequence libraries for configuring a plurality of field control systems which are different from each other.

In some cases, the sequence library assignment processes to assign the first sequence library to the one or more lower level engineering projects may include to assign first sequence library files of the same type to one of the lower level engineering projects simultaneously, with permission in use of a single user and prohibition in use of any other users in respect of one field control station of the one lower engineering project for each sequence library type, wherein the first sequence library files include at least one of SEBOL_USER_FUNCTION, sequential function chart (SFC) and unit procedure type.

In some cases, the sequence library assignment process to assign the first sequence library to the one or more lower level engineering projects may include to assign the first sequence library to an engineering project to generate a first assigned sequence library for configuring a plurality of field control systems which are different from each other.

In other aspects, a computer-implemented engineering system may include, but is not limited to, one or more hardware processors and one or more memories that store a computer software comprising processor-executable instructions, when executed by the one or more hardware processors, to cause the one or more hardware processors to perform at least: a sequence library generation process, a sequence library assignment process and a parallel configuration process. The sequence library generation process is to define a first set of engineering data for a first engineering project to generate a first sequence library for the first engineering project, independently of one or more lower level engineering projects for configuring one or more field control systems of an engineering plant. The one or more lower level engineering projects are lower in engineering-project-hierarchy-level than the first engineering project. The sequence library assignment process is to assign the first sequence library to the one or more lower level engineering projects simultaneously to generate one or more first assigned sequence libraries for the one or more lower level engineering projects for configuring the one or more field control systems. The parallel configuration process is to perform a parallel configuration process which configures the first sequence library for the first engineering project, while assigning the first sequence library to another one or more lower level engineering projects.

In still other aspects, a plant engineering system may include, but is not limited to, a module engineering editor. The module engineering editor may further include, but is not limited to, a library navigator that stores a plurality of modules, a sequence library editor, and a system structure navigator. The sequence library editor is configured to define a first set of engineering data for a first engineering project to generate a first sequence library for the first engineering project, independently of one or more lower level engineering projects for configuring one or more field control systems of an engineering plant. The one or more lower level engineering projects are lower in engineering-project-hierarchy-level than the first engineering project. The sequence library editor is configured to assign the first sequence library to the one or more lower level engineering projects simultaneously to generate one or more first assigned sequence libraries for the one or more lower level engineering projects for configuring the one or more field control systems. The sequence library editor is configured to perform a parallel configuration process which configures the first sequence library for the first engineering project, while assigning the first sequence library to another one or more lower level engineering projects.

In some cases, the sequence library editor is configured to modify the first sequence library for the first engineering project, to generate a first modified sequence library, independently of the one or more lower level engineering projects for configuring the one or more field control systems.

In some cases, the plant engineering system may further include, but is not limited to, a sequence library update manager that is configured to update the first modified sequence library that has been assigned to the one or more lower level engineering projects to generate one or more first updated sequence libraries for the one or more lower level engineering projects.

In some cases, the sequence library editor is configured to duplicate the first sequence library to generate a second sequence library for a second engineering project. The one or more lower level engineering projects are lower in engineering-project-hierarchy-level than the second engineering project. The second engineering project is the same in engineering-data-download-status, assignment-status and engineering-project-hierarchy-level as the first engineering project. The sequence library editor is configured to assign the second updated sequence library to another one or more lower level engineering projects simultaneously to generate one or more second assigned updated sequence libraries for the other one or more lower level engineering projects. The sequence library editor is configured to perform a parallel engineering process for configuration which configures at least one of the first sequence library for the first engineering project and the second updated sequence library for the second engineering project, while assigning at least one of the first sequence library and the second updated sequence library to still other one or more lower level engineering projects. The sequence library editor is configured to export the first set of engineering data of the first sequence library from the first engineering project. The sequence library editor is configured to import the first set of engineering data exported from the first sequence library into the second sequence library of the second engineering project.

In some cases, the sequence library editor is configured to define the first set of engineering data, of which types include at least one of SEBOL_USER_FUNCTION, sequential function chart (SFC) and unit procedure. The sequence library editor is configured to define a plurality of sequence library files belonging to the same type.

In some cases, the sequence library update manager is configured to update the first sequence library for the first engineering project. The sequence library update manager is configured to update the second updated sequence library for the second engineering project independently from updating the first sequence library.

In some cases, the sequence library update manager is configured to update the first sequence library for the first engineering project. The sequence library update manager is configured to update the one or more first assigned sequence libraries for the one or more lower level engineering projects. The sequence library update manager is configured to update the one or more first assigned sequence libraries for the one or more lower level engineering projects in according with a user selection of the first assigned sequence library of the one or more lower level engineering projects.

In some cases, the sequence library editor is configured to assign the first sequence library to a plurality of lower level engineering projects which are different from each other simultaneously to generate a plurality of first assigned sequence libraries for configuring a plurality of field control systems which are different from each other.

In some cases, the sequence library editor is configured to assign first sequence library files of the same type to one of the lower level engineering projects simultaneously, with permission in use of a single user and prohibition in use of any other users in respect of one field control station of the one lower engineering project for each sequence library type, wherein the first sequence library files include at least one of SEBOL_USER_FUNCTION, sequential function chart (SFC) and unit procedure type.

In some cases, the sequence library editor is configured to assign the first sequence library to an engineering project to generate a first assigned sequence library for configuring a plurality of field control systems which are different from each other.

The phrase "defining a first set of engineering data for a first engineering project, independently of one or more different engineering projects" may refer to defining a first set of engineering data for a first engineering project, not depending upon nor based on one or more different engineering projects. The definition process for defining a first set of engineering data for a first engineering project is performed without being influenced by one or more different engineering projects. In some cases, the definition process for defining a first set of engineering data for a first engineering project can be performed in the absence of one or more different engineering projects. In other cases, the definition process for defining a first set of engineering data for a first engineering project can be performed in the presence of one or more different engineering projects, without depending upon or being influenced by the one or more different engineering projects.

The phrase "assigning a set of sequence library to one or more engineering projects simultaneously" may refer to "assigning a set of" sequence library to one or more engineering projects at the same time without intervening any different process or having any time interval.

The phrase "parallel configuration process" may refer to a process for configuring a set of sequence library or libraries for an engineering project in parallel to any other process, wherein the process for configuring the set of sequence library or libraries for an engineering project is performed, while the other process is performed. In some cases, the term "parallel configuration process" may refer to a process for configuring a set of sequence library or libraries for an engineering project is performed, while any other process for assigning the set of sequence library to a different engineering project or projects from one or more engineering projects to which the set of sequence library has already assigned.

The phrase "engineering-data-download-status" may refer to a status of whether engineering data has already been downloaded to a field control station.

The phrase "assignment-status" may refer to a status of whether a sequence library has already been assigned to an engineering project.

The phrase "engineering-project-hierarchy-level" may refer to a level of an engineering project in a hierarchy in which different engineering projects are ranked according to relative-belonging relationships, wherein a lower level engineering project belongs to a higher level engineering project. As an example, an AD project, also referred to as automation design project, could be regarded as a higher level engineering project, and which stores engineering data edited in the engineering tool of the automation engineering system. And under an AD project, a plurality of VP projects, which are regarded as lower level engineering projects, could be registered for engineering use.

In some embodiments, an automatic engineering system may include a sequence library editor that is configured to define a set of sequence libraries for field control stations which belongs to one or more engineering projects simultaneously, without using the system view in the related art to define sequence libraries for field control stations separately and respectively. In some cases, the set of sequence libraries may be a set of same sequence libraries. In other causes, the set of sequence libraries may be a set of different sequence libraries. The sequence library editor is configured to define a set of sequence libraries for a higher level engineering project in the engineering tool of the automation engineering system. Then, the sequence library editor is configured to assign the set of sequence libraries to different lower level engineering projects for field control stations at control unit level. The sequence library editor may be configured to expand the capabilities of module engineering in an engineering tool of an automation engineering system into hardware resources of field control systems such as field control stations at control unit level. The sequence library editor may be configured to seamlessly distribute sequence libraries to one or more field control stations in bulk configuration. The sequence library editor may be configured to export and/or import the sequence libraries among higher level engineering projects which are different from each other. The sequence library editor may be configured to migrate legacy sequence libraries which have been defined by a system view of a lower level engineering system for field control stations separately and respectively, wherein a respective legacy sequence library has been defined for each of field control stations separately. The sequence library editor can be used to improve reusability of engineering data of an automation engineering system and engineering efficiency for an industrial plant.

Figure 2:
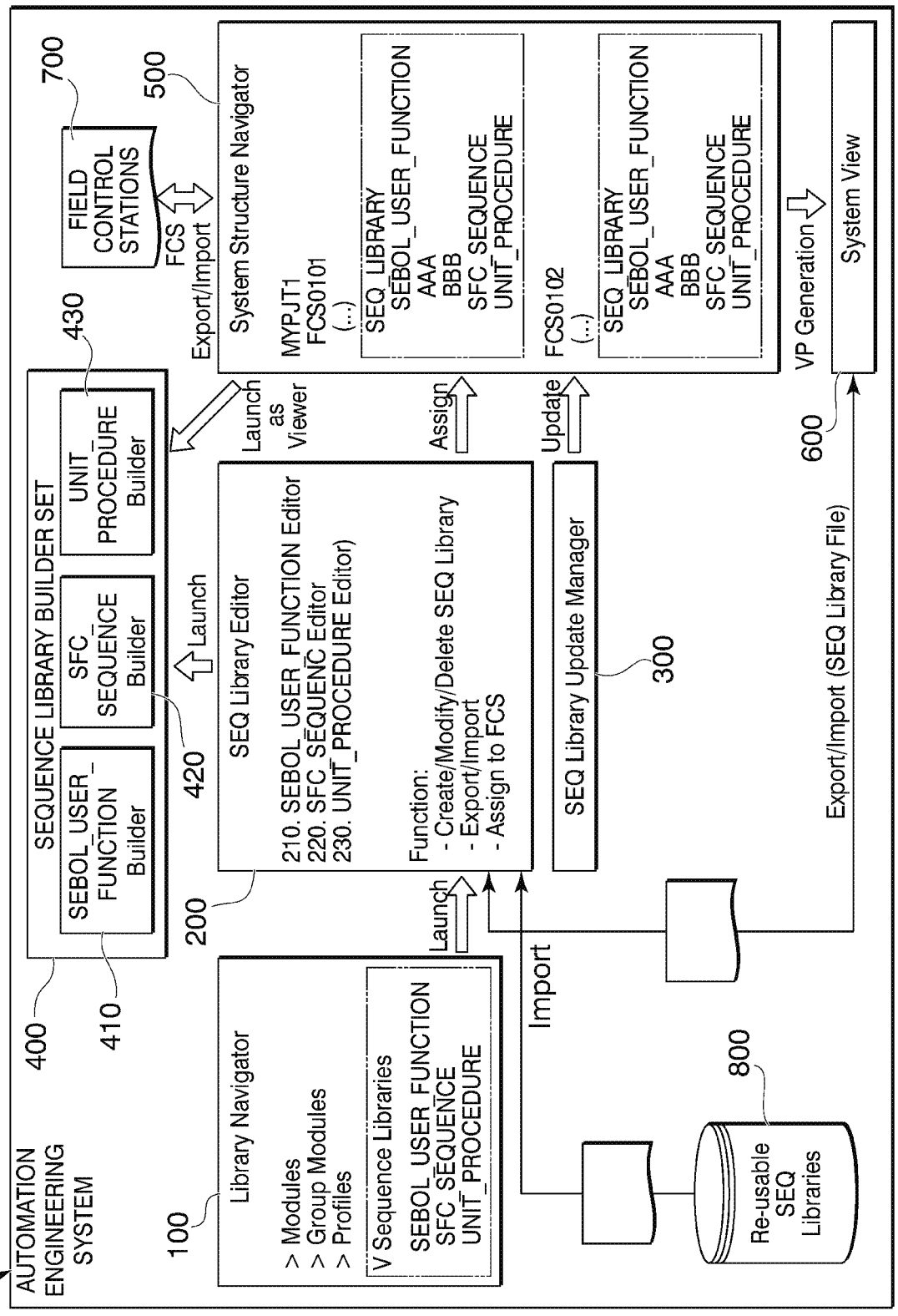
FIG. 2 is a schematic view illustrative of an automation engineering system for processing sequence libraries in some embodiments of the present invention.

FIG. 2 is a schematic view illustrative of an automation engineering system for processing sequence libraries in some embodiments of the present invention.

An automation engineering system 1000 includes an engineering tool of the automation engineering system as an editor tool configured for module-based engineering or group-module-based engineering in an industrial plant. The automation engineering system 1000 includes a library navigator 100, a sequence library editor 200, a sequence library update manager 300, a sequence library builder set 400, a system structure navigator 500, a system view 600, a plurality of field control stations 700 and a reusable sequence library 800. The sequence library builder set 400 may include, but is not limited to, three logic builders, for example, a SEBOL_USER_FUNCTION builder 410, a SEQUENTIAL_FUNCTION_CHART_SEQUENCE builder 420, and a UNIT_PROCEDURE builder 430.

The library navigator 100 is configured to launch the sequence library editor 200. The library navigator 100 has a plurality of modules, a plurality of group modules and profiles which has sequence libraries of SEBOL_USER_FUNCTION, SEQUENTIAL_FUNCTION_CHART_SEQUENCE, and UNIT_PROCEDURE. The sequence library editor 200 is configured to define engineering data for sequence libraries to generate the plurality of sequence libraries at the same time, which include one or more of the following library types, SEBOL_USER_FUNCTION, SEQUENTIAL_FUNCTION_CHART_SEQUENCE, and UNIT_PROCEDURE. The sequence library editor 200 is configured to modify the plurality of sequence libraries at the same time. The sequence library editor 200 is configured to delete the plurality of sequence libraries at the same time. The sequence library editor 200 is configured to export the sequence libraries into the system view 600. The sequence library editor 200 is configured to import the legacy sequence libraries from the reusable sequence library 800, wherein the legacy sequence libraries are defined one by one by the system view for each field control station separately. The sequence library editor 200 may include the three editors, for example, a SEBOL_USER_FUNCTION editor 210, SEQUENTIAL_FUNCTION_CHART_SEQUENCE editor 220, and a UNIT_PROCEDURE editor 230.

The sequence library editor 200 is configured to assign the plurality of sequence libraries to the system structure navigator 500. The sequence library editor 200 is configured to launch the three logic builders, for example, a SEBOL_USER_FUNCTION builder 410, a SEQUENTIAL_FUNCTION_CHART_SEQUENCE builder 420, and a UNIT_PROCEDURE builder 430.

The sequence library update manager 300 is configured to update the sequence libraries assigned to the system structure navigator 500.

The system structure navigator 500 has a plurality of lower level engineering projects under which a plurality of field control stations belong. The sequence library editor 200 is configured to assign a sequence library to the plurality of lower level engineering projects, each of which a plurality of field control stations belong to. Specifically, field control stations under the same lower level engineering project or a plurality of different lower level engineering projects could be assigned by the sequence library editor 200 with the same sequence library generated by the sequence library editor 200. The sequence library assigned to the field control stations may include SEBOL_USER_FUNCTION sequence library, SEQUENTIAL_FUNCTION_CHART sequence library, and UNIT_PROCEDURE sequence library.

The sequence library editor 200 is configured to define a first set of engineering data for a first engineering project such as an automation design project, also be referred to as an AD project to generate a first sequence library for the first engineering project, independently of one or more lower level engineering projects such as CENTUM VP projects, also be referred to as system projects or VP projects, for configuring one or more field control stations of an engineering plant. The one or more lower level engineering projects such as CENTUM VP projects, also be referred to as system projects or VP projects, are lower in engineering-project-hierarchy-level than the first engineering project such as AD project. The sequence library editor 200 is configured to assign the first sequence library to the one or more lower level engineering projects simultaneously to generate one or more first assigned sequence libraries for the one or more lower level engineering projects such as CENTUM VP projects for configuring the one or more field control stations in the system structure navigator 500. The sequence library editor 200 is configured to perform a parallel configuration process which configures the first sequence library for the first engineering project such as AD project, while assigning the first sequence library to another one or more lower level engineering projects such as other VP projects in the system structure navigator 500.

The sequence library editor 200 is configured to modify the first sequence library for the first engineering project such as AD projects, to generate a first modified sequence library, independently of the one or more lower level engineering projects such as VP projects for configuring the one or more field control stations in the system structure navigator 500.

The sequence library update manager 300 is configured to update the first modified sequence library that has been assigned to the one or more lower level engineering projects to generate one or more first updated sequence libraries for the one or more lower level engineering projects.

The sequence library editor 200 is configured to duplicate the first sequence library to generate a second sequence library for a second engineering project. The one or more lower level engineering projects are lower in engineering-project-hierarchy-level than the second engineering project. The second engineering project such as an automation design project, also be referred to as an AD project is the same in engineering-data-download-status, assignment-status and engineering-project-hierarchy-level as the first engineering project. The sequence library editor 200 is configured to assign the second updated sequence library to another one or more lower level engineering projects such as VP projects simultaneously to generate one or more second assigned updated sequence libraries for the other one or more lower level engineering projects such as VP projects. The sequence library editor 200 is configured to perform a parallel engineering process for configuration which configures at least one of the first sequence library for the first engineering project such as AD project and the second updated sequence library for the second engineering project such as AD project, while assigning at least one of the first sequence library and the second updated sequence library to still other one or more lower level engineering projects such as VP projects for field control stations in the system navigator 500. The sequence library editor 200 is configured to export the first set of engineering data of the first sequence library from the first engineering project such as AD project. The sequence library editor 200 is further configured to import the first set of engineering data exported from the first sequence library into the second sequence library of the second engineering project.

The sequence library editor 200 is configured to define the first set of engineering data, of which types include at least one of SEBOL_USER_FUNCTION, Sequential function chart (SFC) and Unit Procedure. The sequence library editor 200 is further configured to define a plurality of sequence library files belonging to the same type.

The sequence library update manager 300 is configured to update the first sequence library for the first engineering project such as an AD project. The sequence library update manager 300 is configured to update the second updated sequence library for the second engineering project such as another AD project independently from updating the first sequence library for the first engineering project such as an AD project.

The sequence library update manager 300 is configured to update the first sequence library for the first engineering project such as an AD project. The sequence library update manager 300 is configured to update the one or more first assigned sequence libraries for the one or more lower level engineering projects for field control stations in the system structure navigator 500. The sequence library update manager 300 is configured to update the one or more first assigned sequence libraries for the one or more lower level engineering projects for field control stations in the system structure navigator 500 in according with a user selection of the first assigned sequence library of the one or more lower level engineering projects for field control stations in the system structure navigator 500.

The sequence library editor 200 is configured to assign the first sequence library to a plurality of lower level engineering projects which are different from each other simultaneously to generate a plurality of first assigned sequence libraries for configuring a plurality of field control stations which are different from each other in the system structure navigator 500.

The sequence library editor 200 is configured to assign the first sequence library to an engineering project to generate a first assigned sequence library for configuring a plurality of field control stations which are different from each other in the system structure navigator 500.

The sequence library editor 200 is configured to assign first sequence library files of the same type to one of the lower level engineering projects simultaneously, with permission in use of a single user and prohibition in use of any other users in respect of one field control station of the one lower engineering project for each sequence library type, wherein the first sequence library files include at least one of SEBOL_USER_FUNCTION, sequential function chart (SFC) and unit procedure. The sequence library editor 200 has a locking feature where only one user can assign the sequence library to the lower-level engineering projects for field control stations at one time for one sequence library type. Any other users are prohibited to assign the sequence library to the same field control stations while the sequence library is being modified by other user. This is to safeguard data integrity and avoid error in concurrency engineering.

The library navigator 100 may be implemented to have a hierarchical view of the libraries of the automation engineering system, which include sequence libraries for SEBOL, SEQUENTIAL FUNCTION CHART (SFC), and UNIT PROCEDURE. As described above, the sequence library editor 200 has the SEBOL_USER_FUNCTION editor 210, the SEQUENTIAL_FUNCTION_CHART_SEQUENCE editor 220, and the UNIT_PROCEDURE editor 230. The library navigator 100 is configured to launch the sequence library editor 200, for example the three sequence library editors; the SEBOL_USER_FUNCTION editor 210, the SEQUENTIAL_FUNCTION_CHART_SEQUENCE editor 220, and the UNIT_PROCEDURE editor 230.

The sequence library editor 200 may be implemented to host the sequence library items in the automation engineering system. User can use the sequence library editor 200 to create, modify, delete, import and export sequence library items. For example, user can use the SEBOL_USER_FUNCTION builder to modify the contents of the sequence library of SEBOL_USER_FUNCTION. User can use the SEQUENTIAL_FUNCTION_CHART_SEQUENCE builder to modify the contents of the sequence library of SEQUENTIAL_FUNCTION_CHART_SEQUENCE. Also user can use the sequence library editor 200 to assign the sequence library to the lower level engineering projects for field control stations in the system structure navigator 500, wherein user can use the sequence library editor 200 to customize the view of a list of field control systems in the system structure navigator 500 and to mark a target field control station to which the sequence library item will be assigned by the sequence library editor 200.

The system structure navigator 500 may be implemented to have a hierarchical view which includes, but not limited to, lower level engineering projects such as VP projects registered in the higher level engineering project such as AD project, wherein the lower level engineering projects are for field control stations in the system structure navigator 500. The system structure navigator 500 is configured to show relationships of field control stations and those assigned sequence library items which have been assigned to those field control stations. The system structure navigator 500 is configured to show generation statuses of each of the assigned sequence library items, wherein the generation statuses are whether the module engineering data has been reflected to the field control station under the lower level engineering project.

The sequence library update manager 300 is configured to allow a user to view a list of assigned sequence libraries and those corresponding version status as "latest" or "obsolete". The sequence library update manager 300 is configured to allow the user to update duplicate copies of the assigned sequence library which has been assigned to the field control stations which are obsoleted as compared to the latest versions or modified versions of the source sequence library items.

The system structure navigator 500 is configured to perform a lower level engineering project generation such as VP project by converting module engineering data of the automation engineering system to reflect the converted module engineering data to the engineering system under the lower level engineering project such as VP projects. The engineering project generation has the sequence library assignment to the field control stations in the system structure navigator 500.

The system view 600 is configured to host the lower level engineering projects as well as those corresponding stations such as human interface stations and field control stations and those sub-components which may include, but not limited to, the sequence libraries that have been assigned to the field control stations. The system view 600 is configured to provide an option or options for field control stations to either configure the sequence libraries from the automation engineering system for the higher level engineering project or legacy modes.

Field control stations 700 as hardware resources are configured to import into the system structure navigator 500 and export from the system structure navigator 500, sequence libraries among higher level engineering projects such as AD projects in order to promote reusability of module engineering of automation design system. Field control stations 700 as hardware resources are configured to import and export sequence libraries without any additional engineering effort for sequence libraries.

Figure 3:
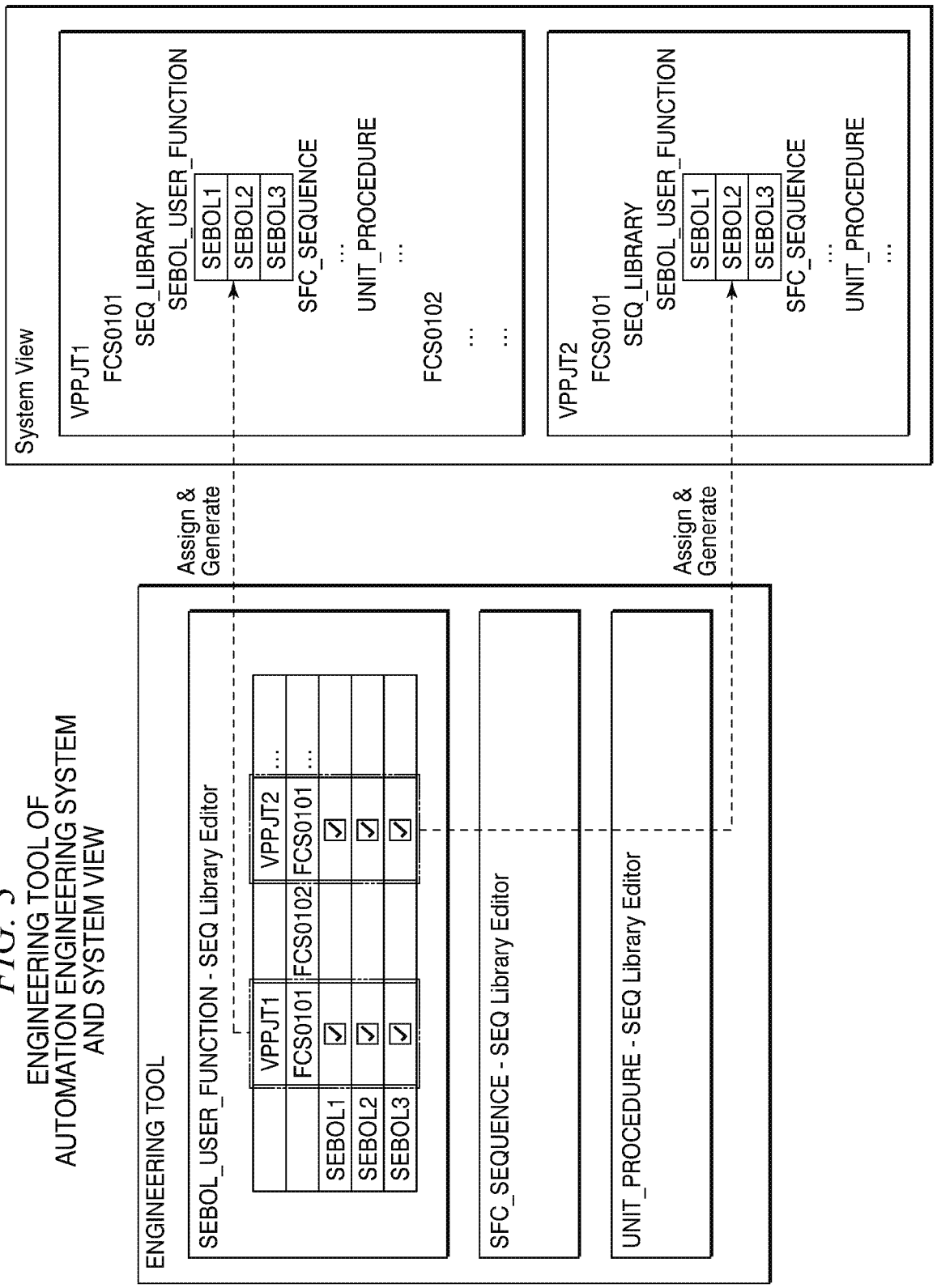
FIG. 3 is an illustrative example of simultaneous assignments or batch distributions of SEBOL sequence library in a sequence library editor in an engineering tool of the automation engineering system to a system view.

FIG. 3 is an illustrative example of simultaneous assignments or batch distributions of SEBOL sequence library in the sequence library editor 200 in the engineering tool of the automation engineering system to the system view 600. The sequence library editor 200 is configured to allow an engineer or user to assign the created or defined one or more sequence libraries to one or more lower level engineering projects such as VP Project at the same time. The sequence library editor 200 is configured to allow a user to create, modify and/or configure one or more sequence libraries at the same time. Additionally, engineer can create sequence library on the sequence library editor 200 without creating lower level engineering projects such as VP Project which promotes parallel engineering process, for example, while one engineering team is defining sequence library on higher-level engineering project such as AD Project while another engineering team is setting up lower level engineering project such as VP Project. The higher-level engineering project such as AD Project is independent of any controllers. Engineer can configure engineering data on higher-level engineering projects such as AD Project beforehand without creating lower level engineering project such as VP Project. As illustrated in FIG. 3, three sequence libraries of SEBOL type, i.e. SEBOL 1, SEBOL 2, and SEBOL3 are created at the same time using SEBOL_USER_FUNCTION editor 210, and the three SEBOL libraries have been assigned to two field control stations (FCS) which respectively belong to two different lower level engineering projects or VP Projects, i.e. FCS0101 of VPPJT1 and FCS0101 VPPJT2 simultaneously.

Figure 4:
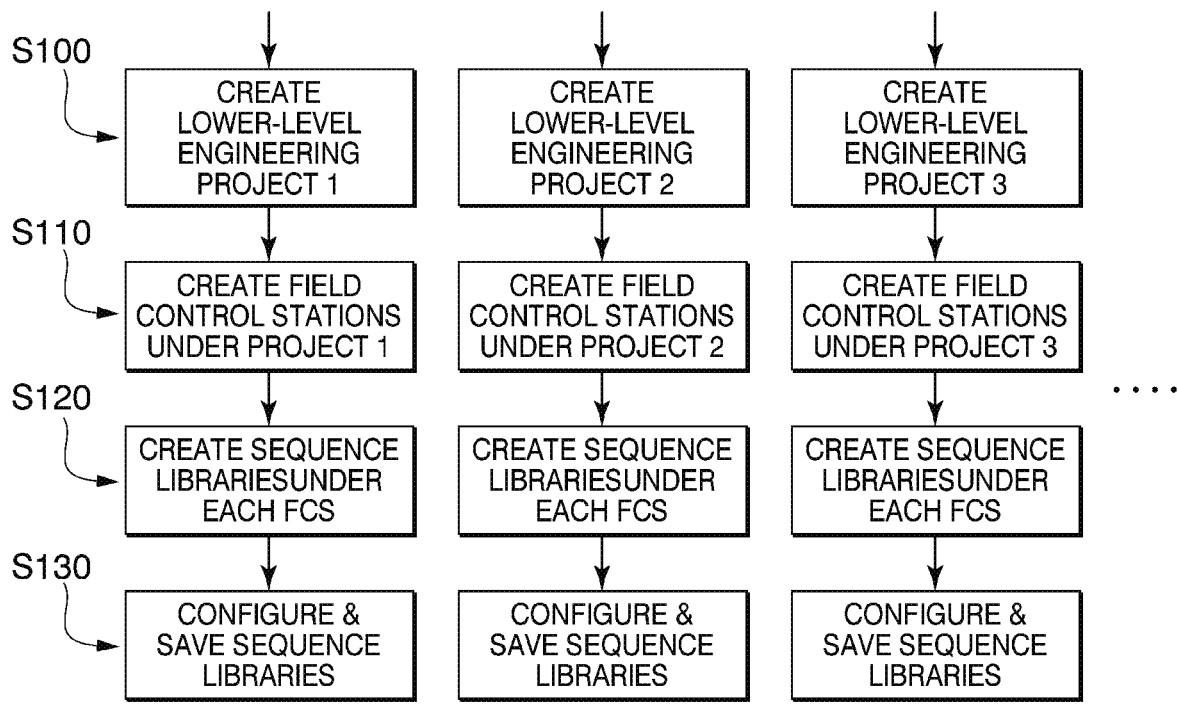
FIG. 4 is a flow chart of engineering process using a system view without using a sequence library editor.

FIG. 4 is a flow chart of engineering process using the system view without using the sequence library editor. In Step S100, a lower level engineering project is created, which is a VP project. In Step S110, field control stations belonging to the VP project are created. In Step S120, sequence libraries under each field control station are created one by one. In Step S130, the created sequence libraries are configured and saved one by one. And the above mentioned process needs to be repeatedly performed for each VP project which may comprise numerous field control stations. Furthermore, if the system view is used, the lower level engineering project and the field control stations have to be created before sequence library is created. In the system view 600, engineer has to create sequence library each time, even if engineer wants to reuse the same sequence library under different field control stations in same or different lower-level engineering project such as VP Project. Even though, engineer can export the existing sequence library and import the existing sequence library to another field control station. Field control stations and lower level engineering project such as VP Project need to be created manually which takes significant efforts and time.

Figure 5:
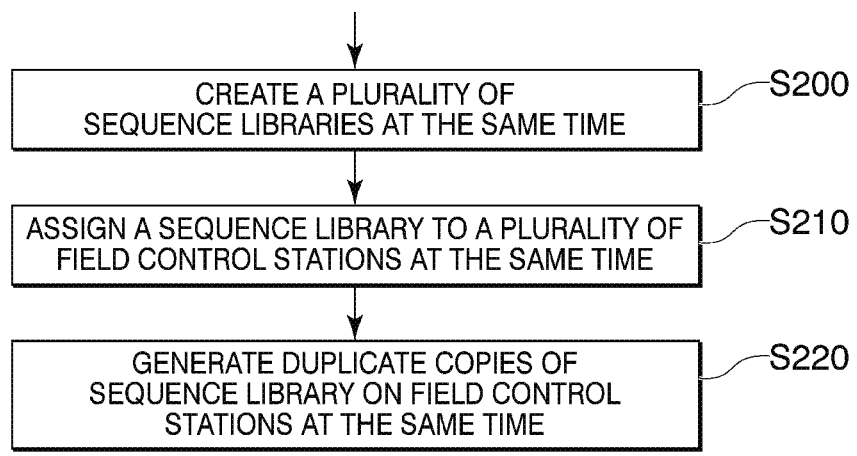
FIG. 5 is a flow chart of engineering process using a sequence library editor.

FIG. 5 is a flow chart of engineering process using the sequence library editor. In Step S200, a plurality of sequence libraries are created at the same time. In Step S210, each created sequence library is assigned to a plurality of field control stations of same or different lower-level engineering projects at the same time. In Step S220, duplicate copies of the sequence library are generated at the same time on the plurality of field control stations of same or different lower-level engineering projects. In the sequence library editor, once sequence library is created, the sequence library can be assigned to multiple field control stations of same or different lower-level engineering projects such as VP Project at the same time. Reusability of sequence library is increased and engineering efforts are minimized.

Figure 6:
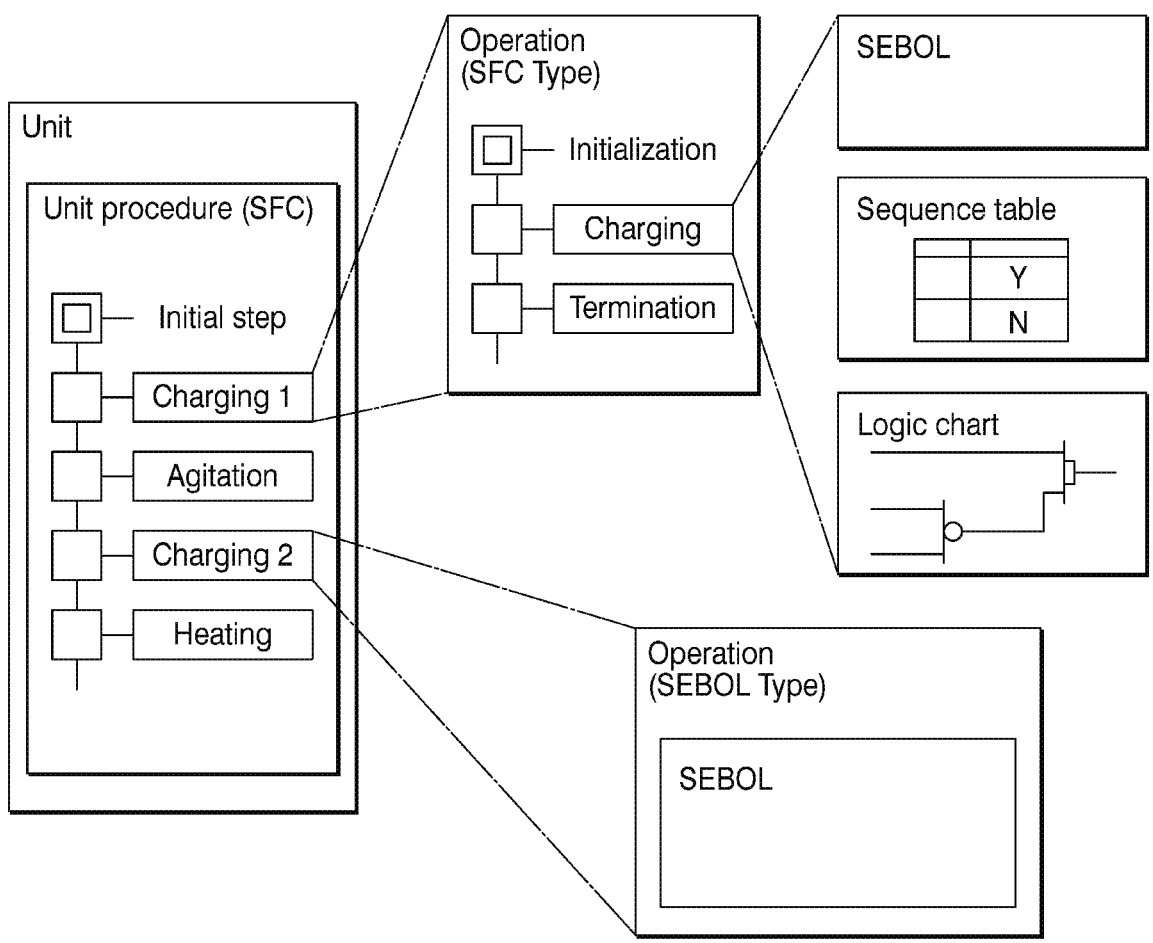
FIG. 6 is a schematic view of relationships among SEBOL, SEQUENTIAL FUNCTION CHART (SFC), and UNIT PROCEDURE.

FIG. 6 is a schematic view of relationships among SEBOL, SEQUENTIAL FUNCTION CHART (SFC), and UNIT PROCEDURE. SEBOL is a programing language designed for process control in field control stations which are hardware resources configured to control field devices via one or more field networks. SEBOL has special functions for the field controls in addition to functions of a general programing language. Programs written in SEBOL language are executable as an action equivalent to a single sequential function chart step on a field control station. The sequential function chart (SFC) is a graphical programming language used to define control sequences. The sequential function chart (SFC) can be written using the sequential function chart (SFC) block, which is a function block included in the sequence control function (SFC). The unit procedure controls the modules grouped in a unit for the production process assigned to the unit. A unit procedure consists of more than one operation executed according to the unit procedure defined for a unit. Execution time is automatically shared when more than one operation required to be executed in parallel. The unit procedure can be described using the sequential function chart (SFC) designed for a purpose. Typically, a unit procedure could be considered positioning in a higher level of a batch process, and a unit procedure may be defined by a plurality of sequential function chart (SFC) and SEBOL.

The engineering tool of the automation engineering system which includes the sequence library editor 200, the sequence library builder set 400 and the sequence library update manager 300 is configured to provide simpler maintenance and management of the sequence library as the sequence libraries are stored in central location and configured in one place in the engineering tool of the automation engineering system in the automation engineering system. Export and Import of sequence library can also be done by the sequence library editor 200.

Figure 7:
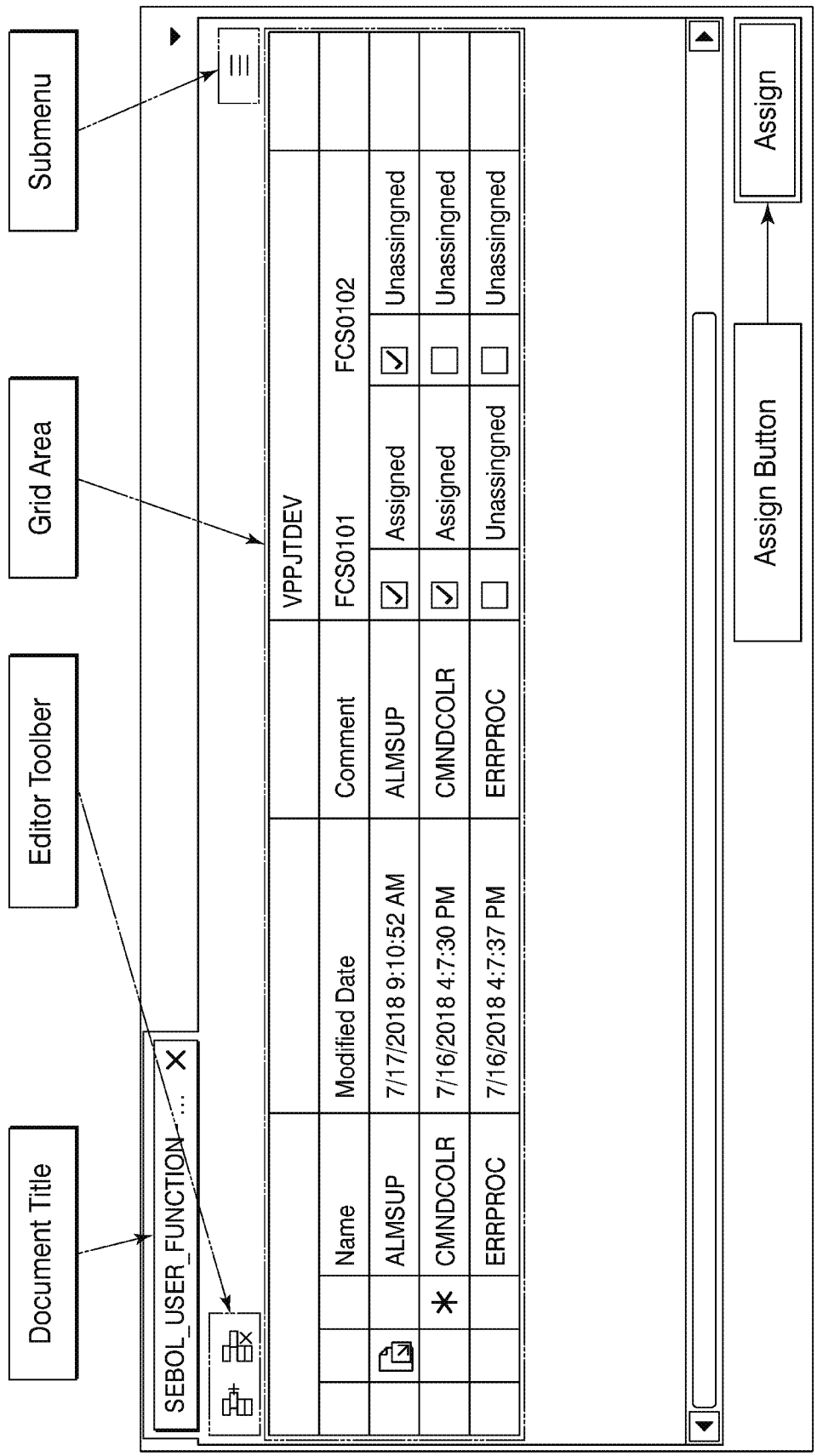
FIG. 7 is a view of a SEBOL sequence library editor for SEBOL.
Figure 8:
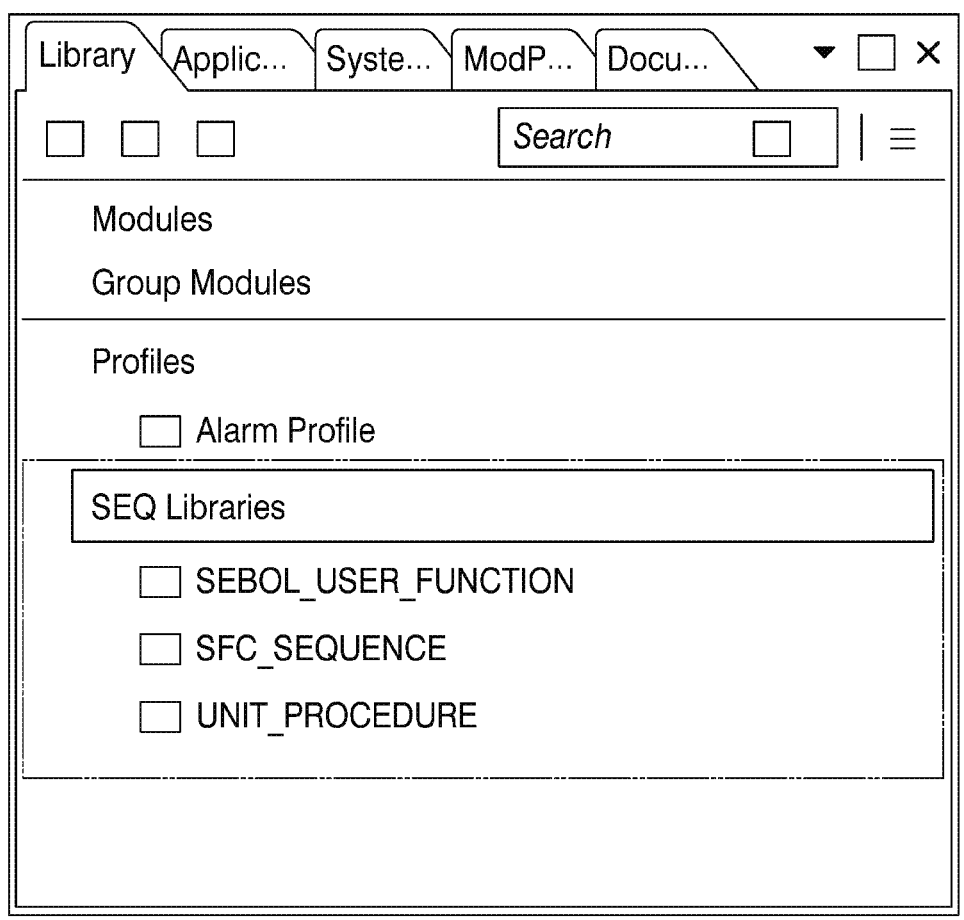
FIG. 8 is a view of a sequence library navigator of an engineering tool of the automation engineering system.
Figure 10:
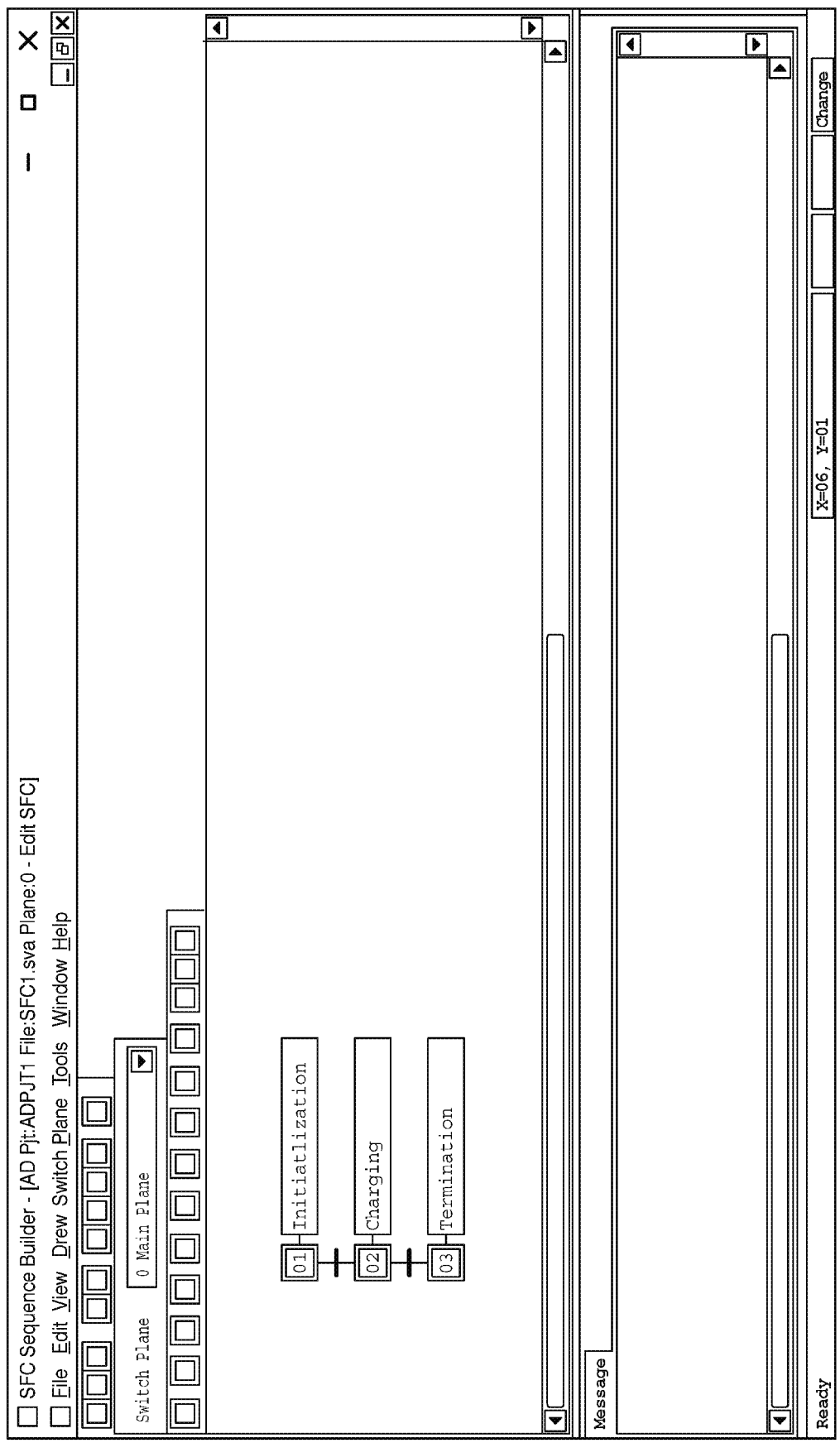
FIG. 10 is a view of a SFC builder of a sequence library builder set.
Figure 11:
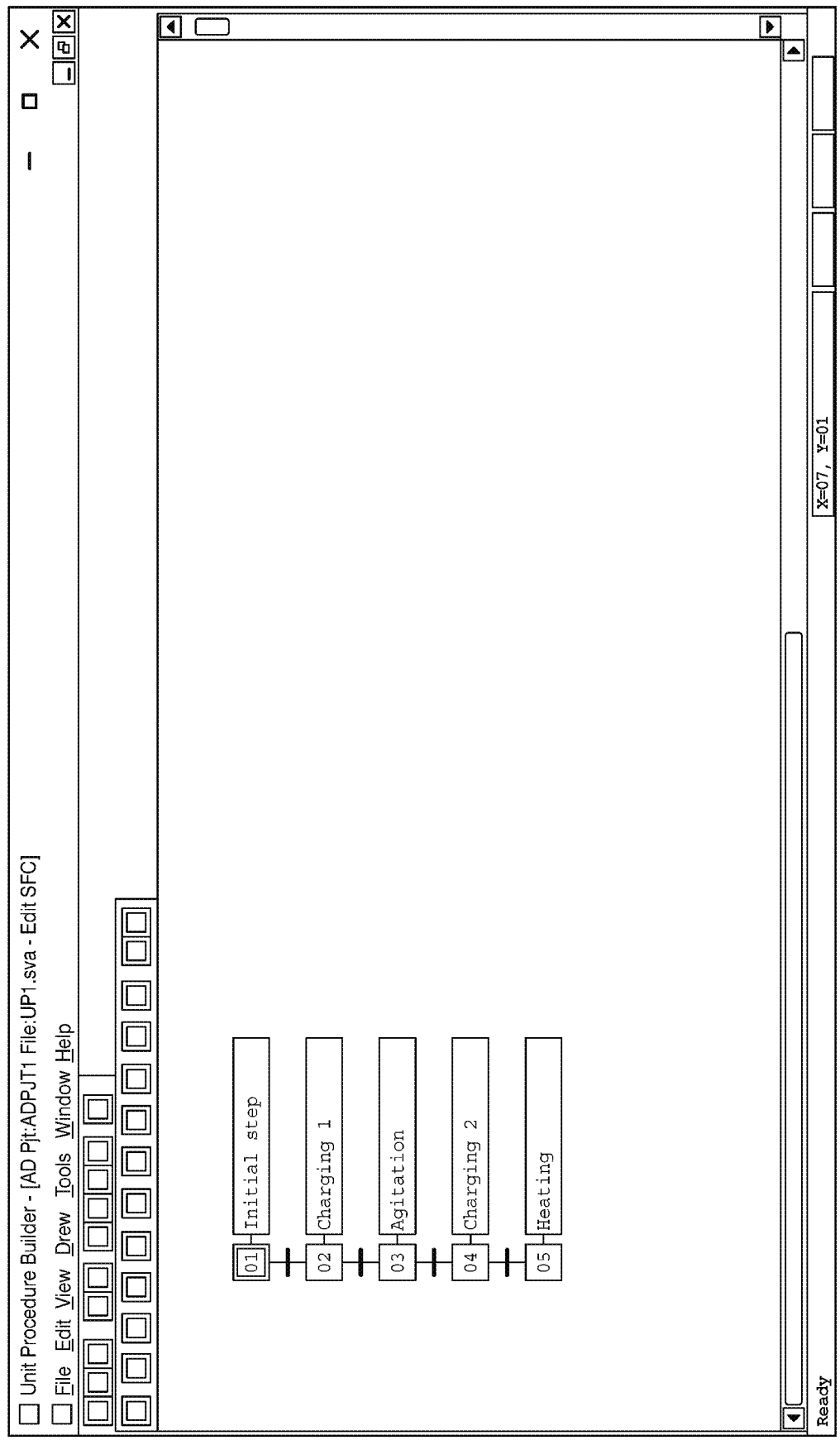
FIG. 11 is a view of a UNIT PROCEDURE builder of a sequence library builder set.

The engineering tool of the automation engineering system which includes the sequence library editor 200, the sequence library builder set 400 and the sequence library update manager 300 is configured to provide central management and central configuration of sequence libraries by the sequence library editor which is configured to view each type of sequence libraries, for example, SEBOL sequence libraries, SEQUENTIAL FUNCTION CHART (SFC) sequence libraries, and UNIT PROCEDURE sequence libraries. FIG. 7 is a view of a SEBOL sequence library editor for SEBOL. The view of SEQUENTIAL FUNCTION CHART (SFC) sequence library editor is similar to the view of a SEBOL sequence library editor for SEBOL. The view of UNIT PROCEDURE sequence library editor is similar to the view of a SEBOL sequence library editor for SEBOL. FIG. 8 is a view of the sequence library navigator 100 of an engineering tool of the automation engineering system. The sequence library navigator 100 is configured to launch the sequence library editor 200, for example, each of SEBOL_USER_FUNCTION editor 210, SEQUENTIAL FUNCTION CHART (SFC) editor 220, and UNIT PROCEDURE editor 230. FIG. 9 is a view of the SEBOL builder 410 of the sequence library builder set 400. SEBOL sequence libraries are engineered using the SEBOL builder 410 of the sequence library builder set 400. FIG. 10 is a view of the SFC builder 420 of the sequence library builder set 400. SFC sequence libraries are engineered using the SFC builder 420 of the sequence library builder set 400. FIG. 11 is a view of the UNIT PROCEDURE builder 430 of the sequence library builder set 400. UNIT PROCEDURE sequence libraries are engineered using the UNIT PROCEDURE builder 430 of the sequence library builder set 400. Users can use the sequence library editor 200 to add a new sequence library or import sequence library.

Figure 12:
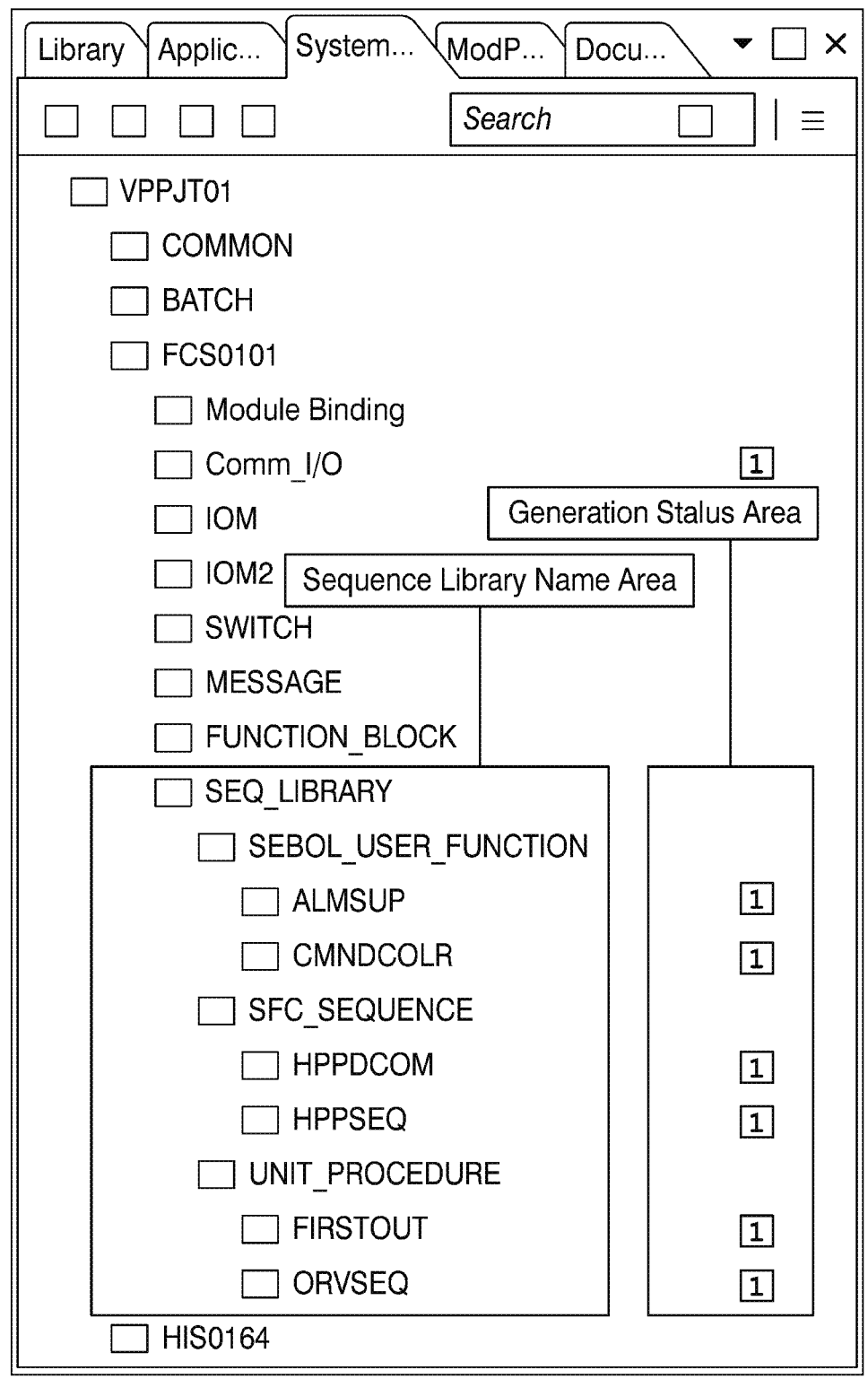
FIG. 12 is a view of a graphical user interface (GUI) of system structure navigator of the engineering tool of the automation engineering system.

The engineering tool of the automation engineering system which includes the sequence library editor 200, the sequence library builder set 400 and the sequence library update manager 300 is configured to provide bulk distribution of sequence libraries to multiple field control systems from different lower-level engineering projects such as VP Projects. The sequence libraries can be distributed to an array of field control stations from different lower level engineering projects such as system projects or VP Projects. User can use the sequence library editors, for example, SEBOL_USER_FUNCTION editor, SFC editor and Unit Procedure editor, and assign each sequence library item to multiple field control stations like a spreadsheet where user can mark a target field control station and click a change assignment button to execute the bulk assignment operation in other words the bulk distribution operation. Once the sequence library is assigned, a copy of the sequence library or in other words, an assigned sequence library with a specific version is placed under each target field control station. FIG. 12 is a view of a graphical user interface GUI of the system structure navigator of the engineering tool of the automation engineering system. "1" represents that the engineering data, for example, sequence libraries for a field control station has not been downloaded to the field control station yet. After executing "generation", the engineering data will be reflected in a target field control station in a plant or a simulated engineering environment, and "1" will no longer be shown. For usability feature, user can use the sequence library editor 200 to filter the target field control system as the number of field control stations registered under the higher level engineering system such as AD Project can be numerous.

Figure 13:
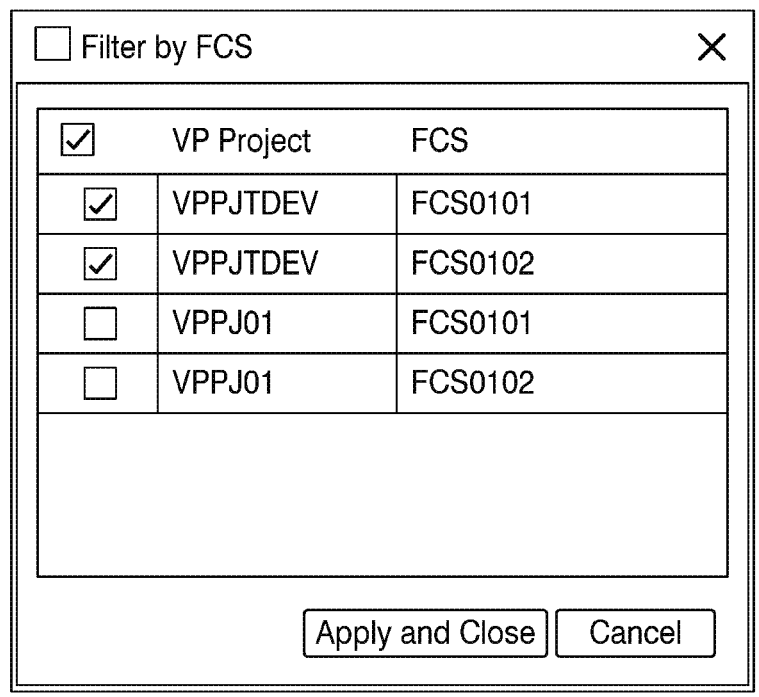
FIG. 13 is a view of filtering by field control station dialog.

FIG. 13 is a view of filtering by field control station dialog from the sequence library editor, through which, numerous field control stations belong to the same lower level engineering project or different lower level engineering projects could be filtered or selected, for the purpose of efficient assignment of sequence libraries to those field control stations.

The engineering tool of the automation engineering system which includes the sequence library editor 200, the sequence library builder set 400 and the sequence library update manager 300 is configured to provide central managements of versioning of the sequence library, differently from separate and respective managements for respective field control stations.

Figure 14:
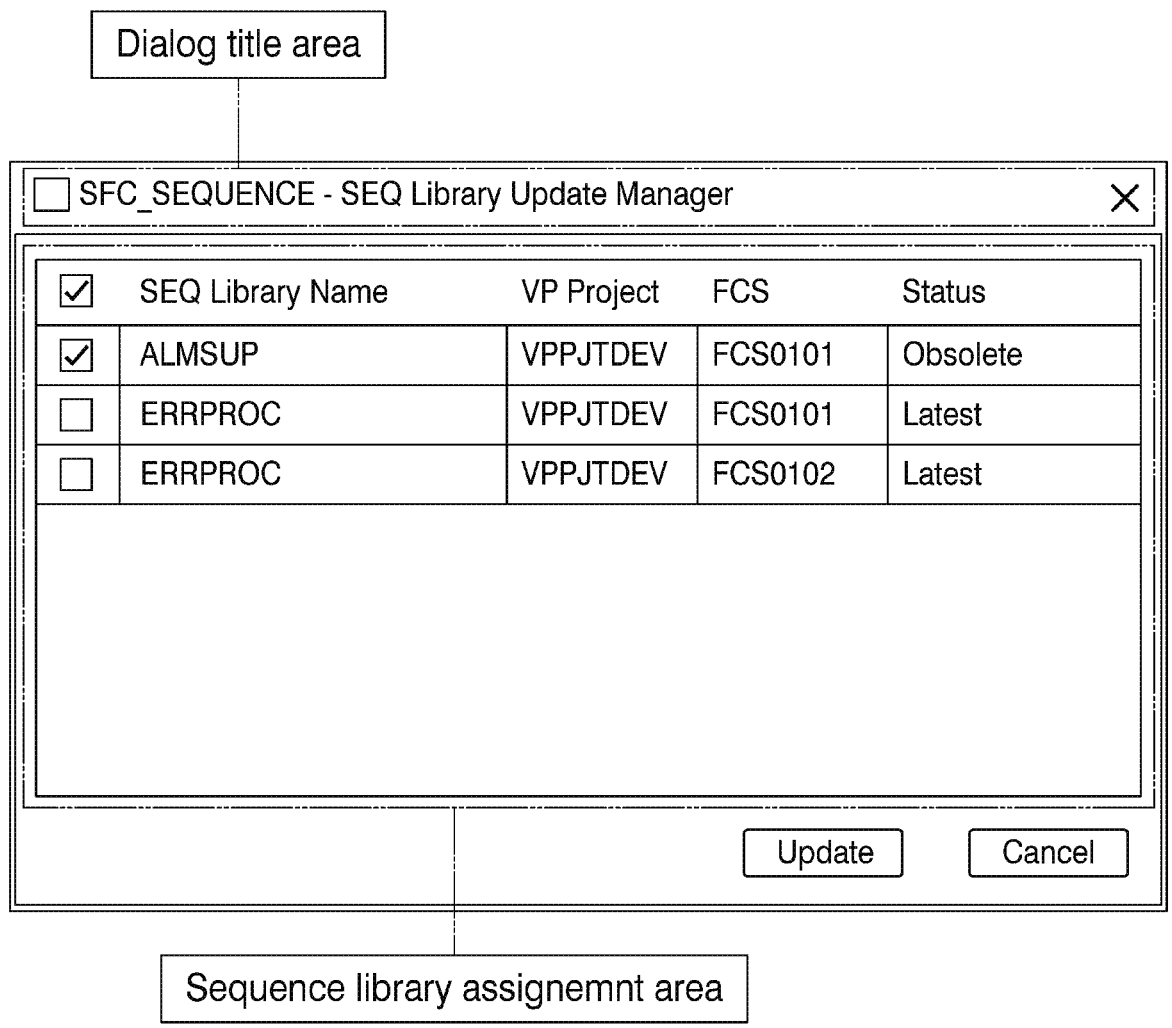
FIG. 14 is a view of a sequence library update manager.

The engineering tool of the automation engineering system which includes the sequence library editor 200, the sequence library builder set 400 and the sequence library update manager 300 is configured to provide central update managements to update sequence libraries and batch distribution of updated sequence libraries to field control stations. Use can use the sequence library update manager 300 to update the sequence libraries in the automation design organization after assignment to field control stations. In this case, the sequence library under the field control stations become obsolete. Use can use the sequence library update manager 300 to update the assigned sequence libraries under each field control station. FIG. 14 is a view of the sequence library update manager 300. If the sequence library update manager 300 is launched by the sequence library editor 200, then the sequence library update manager 300 shows a list of sequence libraries which have been assigned to field control stations and shows the statuses of the assigned sequence libraries as "latest" or "obsolete". User can use the sequence library update manager 300 to select single or multiple obsolete assigned sequence libraries to be updated. Additionally, grid columns enable the user to perform filter in order to customize the view, for instance, user could filter or select all the assigned sequence libraries with "obsolete" status. The latest versions of SEBOL, SFC, and Unit Procedure library have been stored in respective sequence library editors as "master" version. There will be no automatic update for the sequence libraries which have already been assigned to multiple field control systems, if the latest version "master" in the sequence library editor has been updated. Namely, the update operation could be performed to each "copy" of a sequence library, which has been assigned to each individual field control station. By way of an example, if there are two copies of sequence library with "obsolete" status, user can choose to update only one copy of the "obsolete" sequence library, instead of both "obsolete" libraries, based on different engineering phases and requirements.

Figure 15:
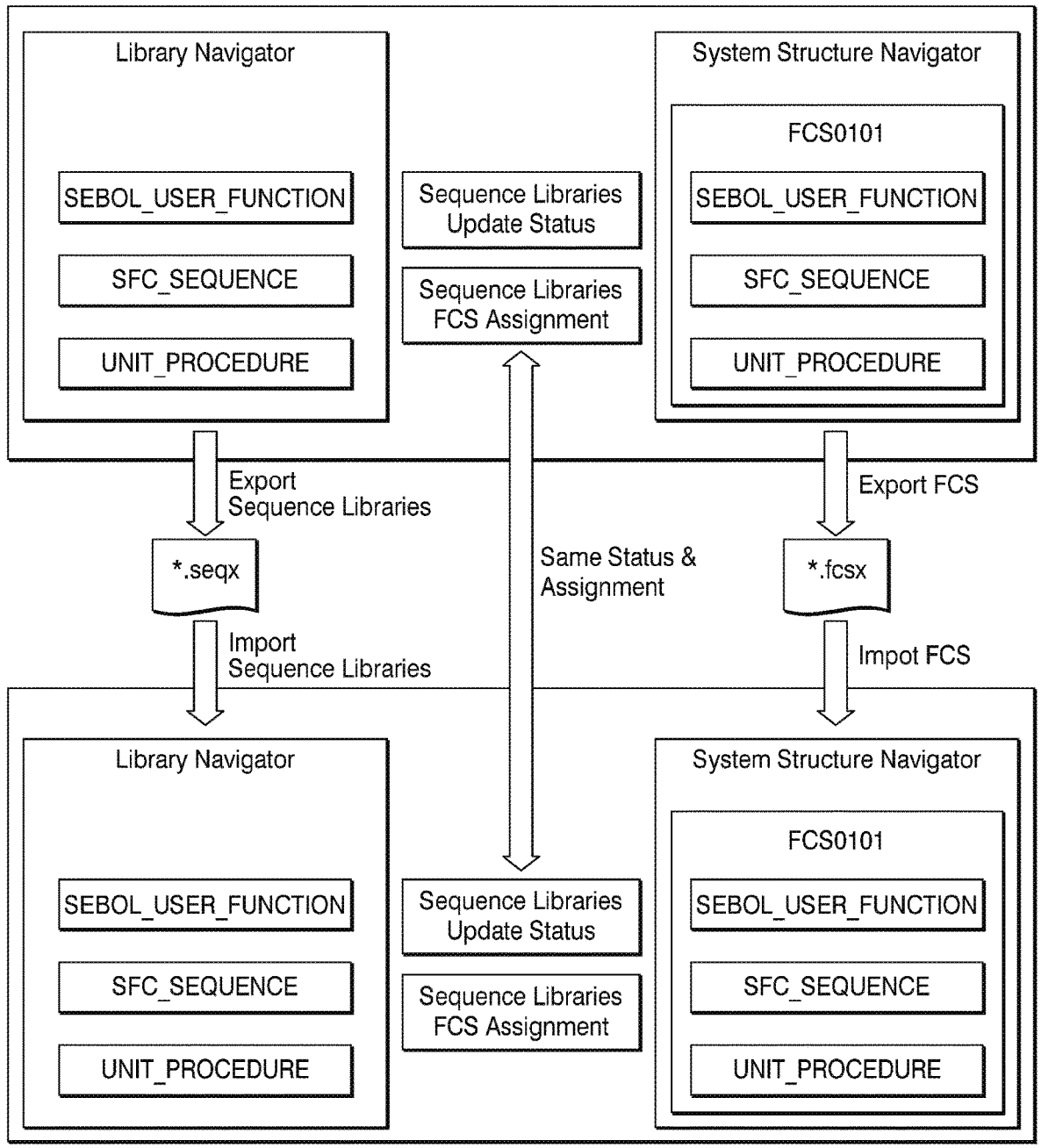
FIG. 15 is a schematic view of exportation and importation of sequence libraries and field control stations between higher level engineering projects.

The engineering tool of the automation engineering system which includes the sequence library editor 200, the sequence library builder set 400 and the sequence library update manager 300 is configured to provide enhanced reusability of the module engineering data such as the automation design engineering data, which includes sequence libraries and expands the scope of module engineering to the control unit level such as the level of field control stations. The enhanced module engineering paradigm of automation design system to control unit level such as a field control station level has reduced the engineering efforts and significantly improved engineering efficiency for industrial control systems, by having the capabilities of bulk assignment of a sequence library to a plurality of filed control stations of the same lower level engineering project or different lower level engineering projects, and in support of importation and exportation sequence libraries between AD projects. The sequence libraries and field control stations can be exported and imported among higher level engineering projects such as AD Projects and restore their exact states from the source project are restored. FIG. 15 is a schematic view of exportation and importation of sequence libraries and field control stations between the higher level engineering projects such as AD projects. If user do not use the sequence library editor 200, user must configure the sequence library in the system view 600 by manual import in order to completely restore the exact state of the field control system with sequence libraries. Non-use of the sequence library editor 200 will limit the module engineering usability and reusability of the automation engineering system.

Figure 16:
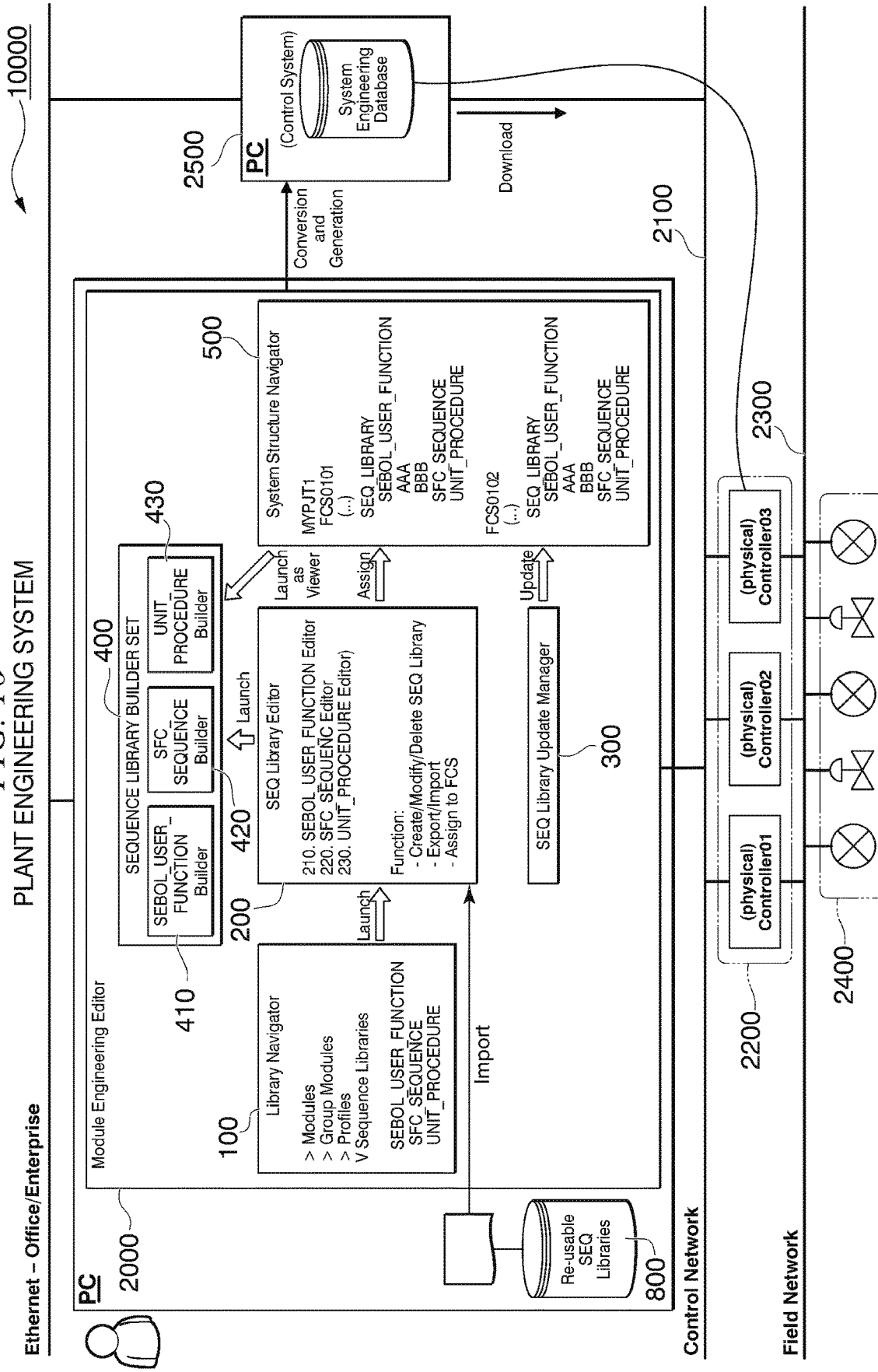
FIG. 16 is a block diagram illustrative of a plant engineering system which includes a module engineering system which uses sequence libraries.

FIG. 16 is a block diagram illustrative of a plant engineering system which includes a module engineering system which uses sequence libraries. The automation engineering system 1000 as described with reference to FIGS. 2 through 15 is applicable to a plant engineering system 10000 of FIG. 16. The plant engineering system 10000 includes a module engineering editor 2000, a control network 2100, a plurality of physical field control stations 2200, a field network 2300, a plurality of field devices 2400, a control system 2500, and a reusable sequence library 800. The control system 2500 has a system engineering database. The control system 2500 is connected via any available network such as Ethernet to the module engineering editor 2000. The control system 2500 is connected via the control network 2100 to the plurality of physical field control stations 2200. The plurality of physical field control stations 2200 are connected to the field network 2300 which is further connected to the plurality of field devices 2400, so that the plurality of physical field control stations 2200 control the plurality of field devices 2400. The module engineering editor 2000 is included in the automation engineering system 1000 of FIG. 2. The module engineering editor 2000 includes the library navigator 100, the sequence library editor 200, the sequence library update manager 300, the sequence library builder set 400, the system structure navigator 500. The sequence library builder set 400 includes the SEBOL_USER_FUNCTION builder 410, the SEQUENTIAL_FUNCTION_CHART SEQUENCE builder 420, and the UNIT_PROCEDURE builder 430. The automation engineering system 1000 as described with reference to FIGS. 2 through 15 are used for further improving the efficiency of engineering process for industrial automation system.

The systems and methods in the above-described embodiments may be deployed in part or in whole through a machine or circuitry that executes computer software, software components, program codes, and/or instructions on one or more processors. The one or more processors may be part of a general-purpose computer, a server, a cloud server, a client, network infrastructure, mobile computing platform, stationary computing platform, or other computing platform. One or more processors may be any kind of computational or processing device or devices which are capable of executing program instructions, codes, binary instructions and the like. The one or more processors may be or include a signal processor, digital processor, embedded processor, microprocessor or any variants such as a co-processor, for example, math co-processor, graphic co-processor, communication co-processor and the like that may directly or indirectly facilitate execution of program codes or program instructions stored thereon. In addition, the one or more processors may enable execution of multiple programs, threads, and codes. The threads may be executed simultaneously to enhance the performance of the one or more processors and to facilitate simultaneous operations of the application. Program codes, program instructions and the like described herein may be implemented in one or more threads. The one or more processors may include memory that stores codes, instructions and programs as described herein. The processor may access a non-transitory processor-readable storage medium through an interface that may store codes, instructions and programs as described herein and elsewhere. The non-transitory processor-readable storage medium associated with the processor for storing programs, codes, program instructions or other type of instructions capable of being executed by the computing or processing device may include but may not be limited to one or more of a memory, hard disk, flash drive, RAM, ROM, CD-ROM, DVD, cache and the like.

A processor may include one or more cores that may enhance speed and performance of a multiprocessor. In some embodiments, the process may be a dual core processor, quad core processors, other chip-level multiprocessor and the like that combine two or more independent cores.

The methods and systems described herein may be deployed in part or in whole through a machine that executes computer software on a server, client, firewall, gateway, hub, router, or other such computer and/or networking hardware.

The software program may be associated with one or more client that may include a file client, print client, domain client, internet client, intranet client and other variants such as secondary client, host client, distributed client and the like. The client may include one or more of memories, processors, computer readable media, storage media, physical and virtual ports, communication devices, and interfaces capable of accessing other clients, servers, machines, and devices through a wired or a wireless medium, and the like. The programs or codes as described herein may be executed by the client. In addition, other devices required for execution of methods as described in this application may be considered as a part of the infrastructure associated with the client. The client may provide an interface to other devices including servers, other clients, printers, database servers, print servers, file servers, communication servers, distributed servers and the like. This coupling and/or connection may facilitate remote execution of program across the network. The networking of some or all of these devices may facilitate parallel processing of a program or method at one or more location. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The software program may be associated with one or more servers that may include a file server, print server, domain server, internet server, intranet server and other variants such as secondary server, host server, distributed server and the like. The server may include one or more of memories, processors, computer readable media, storage media, physical and virtual ports, communication devices, and interfaces capable of accessing other servers, clients, machines, and devices through a wired or a wireless medium, and the like. The methods, programs or codes as described herein may be executed by the server. In addition, other devices required for execution of methods as described in this application may be considered as a part of the infrastructure associated with the server. The server may provide an interface to other devices including clients, other servers, printers, database servers, print servers, file servers, communication servers, distributed servers, social networks, and the like. This coupling and/or connection may facilitate remote execution of program across the network. The networking of some or all of these devices may facilitate parallel processing of a program or method at one or more locations. Any of the devices attached to the server through an interface may include at least one storage medium capable of storing programs, codes and/or instructions. A central repository may provide program instructions to be executed on different devices. In this implementation, the remote repository may act as a storage medium for program codes, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing devices associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer to peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory, for example, USB sticks or keys, floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods, devices, apparatus, and systems described herein may transform physical and/or or intangible items from one state to another. The methods and systems described herein may also transform data representing physical and/or intangible items from one state to another.

The modules, engines, components, and elements described herein, including in flow charts and block diagrams throughout the figures, imply logical boundaries between the modules, engines, components, and elements. However, according to software or hardware engineering practices, the modules, engines, components, and elements and the functions thereof may be implemented on one or more processors, computers, machines through computer executable media, which are capable of executing program instructions stored thereon as a monolithic software structure, as standalone software modules, or as modules that employ external routines, codes, services, or any combination of these, and all such implementations may be within the scope of the present disclosure. Examples of such machines may include, but is not limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers, processor-embedded eyewear and the like. Furthermore, the modules, engines, components, and elements in the flow chart and block diagrams or any other logical component may be implemented on one or more machines, computers or processors capable of executing program instructions. Whereas the foregoing descriptions and drawings to which the descriptions have been referred set forth some functional aspects of the disclosed systems, no particular arrangement of software for implementing these functional aspects should be inferred from these descriptions unless explicitly stated or otherwise clear from the context. It will also be appreciated that the various steps identified and described above may be varied, and that the order of steps may be adapted to particular applications of the techniques disclosed herein. All such variations and modifications are intended to fall within the scope of this disclosure. The descriptions of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using an object oriented programming language that may be stored, and compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While certain embodiments of the present inventions have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A computer-implemented engineering method, comprising:
   defining a first set of engineering data for a first engineering project to generate a first sequence library for the first engineering project, the first set of engineering data being defined without depending on or being influenced by one or more lower level engineering projects for configuring one or more field control systems of an engineering plant, wherein the one or more lower level engineering projects are lower in engineering-project-hierarchy-level than the first engineering project;

assigning, by a processor and based on user input to a graphical user interface (GUI), the first sequence library to the one or more lower level engineering projects simultaneously to generate one or more first assigned sequence libraries for the one or more lower level engineering projects for configuring the one or more field control systems;

performing, by the processor, a parallel configuration process which simultaneously configures the first sequence library for the first engineering project, while assigning the first sequence library to another one or more lower level engineering projects different from the one or more lower level engineering projects;

determining, by the processor, that the one or more first assigned sequence libraries is obsolete;

rendering, by the processor to the GUI, an indication that the one or more first assigned sequence libraries is obsolete and an option to update the one or more first assigned sequence libraries; and updating, in response to user input to the GUI that selects the option to update the one or more first assigned sequence libraries, the one or more first assigned sequence libraries to generate one or more first updated sequence libraries for the one or more lower level engineering projects.

2. The computer-implemented engineering method according to claim 1, further comprising:

modifying the first sequence library for the first engineering project, to generate a first modified sequence library, independently of the one or more lower level engineering projects for configuring the one or more field control systems.

3. The computer-implemented engineering method according to claim 1, further comprising:

rendering, by the processor to the GUI, an indication that the one or more first assigned sequence libraries has been updated to the one or more first updated sequence libraries.

4. The computer-implemented engineering method according to claim 1, further comprising:

duplicating the first sequence library to generate a second sequence library for a second engineering project, wherein the one or more lower level engineering projects are lower in engineering-project-hierarchy-level than the second engineering project, and the second engineering project is the same in engineering-data-download-status, assignment-status and engineering-project-hierarchy-level as the first engineering project;

updating a second set of engineering data for the second engineering project to generate a second updated sequence library for the second engineering project;

assigning the second updated sequence library, to another one or more lower level engineering projects simultaneously to generate one or more second assigned updated sequence libraries for the another one or more lower level engineering projects; and performing a parallel engineering process for configuration which configures at least one of the first sequence library for the first engineering project and the second updated sequence library for the second engineering project, while assigning at least one of the first sequence library and the second updated sequence library to still other one or more lower level engineering projects.

5. The computer-implemented engineering method according to claim 4, further comprising:

exporting the first set of engineering data of the first sequence library from the first engineering project; and importing the first set of engineering data exported from the first sequence library into the second sequence library of the second engineering project.

6. The computer-implemented engineering method according to claim 4, further comprising:

updating the first sequence library for the first engineering project; and updating the second updated sequence library for the second engineering project independently from updating the first sequence library.

7. The computer-implemented engineering method according to claim 1, wherein defining the first set of engineering data for the first engineering project to generate the first sequence library for the first engineering project comprises:

defining the first set of engineering data, of which types include at least one of SEBOL_USER_FUNCTION, sequential function chart (SFC) and unit procedure.

8. The computer-implemented engineering method according to claim 7, wherein defining the first set of engineering data, comprising: defining a plurality of sequence library files belonging to the same type.

9. The computer-implemented engineering method according to claim 1, further comprising:

updating the first sequence library for the first engineering project.

10. The computer-implemented engineering method according to claim 9, further comprising:

updating the one or more first assigned sequence libraries for the one or more lower level engineering projects in accordance with a user selection.

11. The computer-implemented engineering method according to claim 1, wherein assigning the first sequence library to the one or more lower level engineering projects comprises:

assigning the first sequence library to a plurality of lower level engineering projects which are different from each other simultaneously to generate a plurality of first assigned sequence libraries for configuring a plurality of field control systems which are different from each other.

12. The computer-implemented engineering method according to claim 1, wherein assigning the first sequence library to the one or more lower level engineering projects comprises:

assigning first sequence library files of the same type to one of the one or more lower level engineering projects simultaneously, with permission in use of a single user and prohibition in use of any other users in respect of one field control station of the one or more lower level engineering projects for each sequence library type, wherein the first sequence library files include at least one of SEBOL_USER_FUNCTION, sequential function chart (SFC) and unit procedure type.

13. The computer-implemented engineering method according to claim 1, wherein the one or more field control systems comprise a plurality of field control systems which are different from each other.

14. A computer-implemented engineering system, comprising:
one or more hardware processors; and
one or more memories that store a computer software comprising processor-executable instructions, when executed by the one or more hardware processors, to cause the one or more hardware processors to at least:
define a first set of engineering data for a first engineering project to generate a first sequence library for the first engineering project, the first set of engineering data being defined without depending on or being influenced by one or more lower level engineering projects for configuring one or more field control systems of an engineering plant, wherein the one or more lower level engineering projects are lower in engineering-project-hierarchy-level than the first engineering project;
assign, based on user input to a graphical user interface (GUI), the first sequence library to the one or more lower level engineering projects simultaneously to generate one or more first assigned sequence libraries for the one or more lower level engineering projects for configuring the one or more field control systems;
perform a parallel configuration process which simultaneously configures the first sequence library for the first engineering project, while assigning the first sequence library to another one or more lower level engineering projects different from the one or more lower level engineering projects;
determine that the one or more first assigned sequence libraries is obsolete:
render, to the GUI, an indication that the one or more first assigned sequence libraries is obsolete and an option to update the one or more first assigned sequence libraries; and
update, in response to user input to the GUI that selects the option to update the one or more first assigned sequence libraries, the one or more first assigned sequence libraries to generate one or more first updated sequence libraries for the one or more lower level engineering projects.

15. A plant engineering system, comprising:
a module engineering editor which further comprises:
a library navigator that stores a plurality of modules;
a sequence library editor; and
a system structure navigator; and
a sequence library update manager, and
wherein the sequence library editor is configured to:
define a first set of engineering data for a first engineering project to generate a first sequence library for the first engineering project, the first set of engineering data being defined without depending on or being influenced by one or more lower level engineering projects for configuring one or more field control systems of an engineering plant, wherein the one or more lower level engineering projects are lower in engineering-project-hierarchy-level than the first engineering project;
assign, based on user input to a graphical user interface (GUI), the first sequence library to the one or more lower level engineering projects simultaneously to generate one or more first assigned sequence libraries for the one or more lower level engineering projects for configuring the one or more field control systems; and
perform a parallel configuration process which simultaneously configures the first sequence library for the first engineering project, while assigning the first sequence library to another one or more lower level engineering projects different from the one or more lower level engineering projects,
wherein the sequence library update manager is configured to:
determine that the one or more first assigned sequence libraries is obsolete;
render, to the GUI, an indication that the one or more first assigned sequence libraries is obsolete and an option to update the one or more first assigned sequence libraries; and
update, in response to user input to the GUI that selects the option to update the one or more first assigned sequence libraries, the one or more first assigned sequence libraries to generate one or more first updated sequence libraries for the one or more lower level engineering projects.

16. The plant engineering system according to claim 15, wherein the sequence library editor is configured further to:
modify the first sequence library for the first engineering project, to generate a first modified sequence library, independently of the one or more lower level engineering projects for configuring the one or more field control systems.

17. The plant engineering system according to claim 15, wherein the sequence library update manager is configured to render, to the GUI, an indication that the one or more first assigned sequence libraries has been updated to the one or more first updated sequence libraries.

18. The plant engineering system according to claim 15, wherein the sequence library editor is configured further to:
duplicate the first sequence library to generate a second sequence library for a second engineering project, wherein the one or more lower level engineering projects are lower in engineering-project-hierarchy-level than the second engineering project, and the second engineering project is the same in engineering-data-download-status, assignment-status and engineering-project-hierarchy-level as the first engineering project;
update a second set of engineering data for the second engineering project to generate a second updated sequence library for the second engineering project;
assign the second updated sequence library, to another one or more lower level engineering projects simultaneously to generate one or more second assigned updated sequence libraries for the another one or more lower level engineering projects; and
perform a parallel engineering process for configuration which configures at least one of the first sequence library for the first engineering project and the second updated sequence library for the second engineering project, while assigning at least one of the first sequence library and the second updated sequence library to still other one or more lower level engineering projects.

19. The plant engineering system according to claim 18, wherein the sequence library editor is configured further to:
export the first set of engineering data of the first sequence library from the first engineering project; and
import the first set of engineering data exported from the first sequence library into the second updated sequence library of the second engineering project.

20. The plant engineering system according to claim 18, wherein the sequence library editor is configured further to:

update the first sequence library for the first engineering project; and
update the second updated sequence library for the second engineering project independently from updating the first sequence library.

21. The plant engineering system according to claim 15, wherein the sequence library editor is configured further to:
define the first set of engineering data, of which types include at least one of SEBOL_USER_FUNCTION, sequential function chart (SFC) and unit procedure.

22. The plant engineering system according to claim 21, wherein the sequence library editor is configured further to:
define a plurality of sequence library files belonging to the same type.

23. The plant engineering system according to claim 15, wherein the sequence library editor is configured further to:
update the first sequence library for the first engineering project.

24. The plant engineering system according to claim 23, wherein the sequence library editor is configured further to:
update the one or more first assigned sequence libraries for the one or more lower level engineering projects in accordance with a user selection.

25. The plant engineering system according to claim 15, wherein the sequence library editor is configured further to:
assign the first sequence library to a plurality of lower level engineering projects which are different from each other simultaneously to generate a plurality of first assigned sequence libraries for configuring a plurality of field control systems which are different from each other.

26. The plant engineering system according to claim 15, wherein the sequence library editor is configured further to:
assign first sequence library files of the same type to one of the lower level engineering projects simultaneously, with permission in use of a single user and prohibition in use of any other users in respect of one field control station of the one or more lower level engineering projects for each sequence library type, wherein the first sequence library files include at least one of SEBOL_USER_FUNCTION, sequential function chart (SFC) and unit procedure type.

27. The plant engineering system according to claim 15, wherein the one or more field control systems comprise a plurality of field control systems which are different from each other.

* * * * *